United States Patent
Liu

(10) Patent No.: US 9,459,301 B2
(45) Date of Patent: Oct. 4, 2016

(54) APPARATUSES AND METHODS FOR MEASURING FLICKER NOISE

(71) Applicant: PROPLUS ELECTRONICS CO., LTD., Jinan (CN)

(72) Inventor: Zhihong Liu, Cupertino, CA (US)

(73) Assignee: PROPLUS DESIGN SOLUTIONS, INC., San Jose, CA (US)

( * ) Notice: Subject to any disclaimer, the term of this patent is extended or adjusted under 35 U.S.C. 154(b) by 361 days.

(21) Appl. No.: 14/165,292

(22) Filed: Jan. 27, 2014

(65) Prior Publication Data

US 2015/0212131 A1    Jul. 30, 2015

(51) Int. Cl.

| G01R 31/02 | (2006.01) |
|---|---|
| G01R 29/26 | (2006.01) |
| G01R 31/26 | (2014.01) |
| H03F 1/02 | (2006.01) |
| H03F 1/52 | (2006.01) |
| H03F 3/195 | (2006.01) |
| H03F 3/45 | (2006.01) |
| H03F 3/72 | (2006.01) |

(52) U.S. Cl.
CPC ............ *G01R 29/26* (2013.01); *G01R 31/2646* (2013.01); *H03F 1/0277* (2013.01); *H03F 1/52* (2013.01); *H03F 3/195* (2013.01); *H03F 3/45475* (2013.01); *H03F 3/72* (2013.01); *H03F 2200/261* (2013.01); *H03F 2200/411* (2013.01); *H03F 2200/462* (2013.01); *H03F 2200/471* (2013.01); *H03F 2203/7215* (2013.01); *H03F 2203/7221* (2013.01); *H03F 2203/7236* (2013.01)

(58) Field of Classification Search
CPC .... G01R 29/26; G01R 31/2646; G01R 1/18; G01R 1/30; G01R 33/0354; H01L 22/34; H03F 1/0277; H03F 1/52; H03F 2200/261; H03F 2200/411; H03F 2200/462; H03F 2200/471; H03F 2203/7215; H03F 2203/7221; H03F 2203/7236; H03F 3/195
USPC .................................................. 324/612, 613
See application file for complete search history.

(56) References Cited

U.S. PATENT DOCUMENTS

| 6,693,439 | B1 * | 2/2004 | Liu | ......................... | G01R 29/26 |
|---|---|---|---|---|---|
| | | | | | 324/612 |
| 2010/0127714 | A1 * | 5/2010 | Negishi | .................. | G01R 29/26 |
| | | | | | 324/613 |

* cited by examiner

*Primary Examiner* — Vincent Q Nguyen
(74) *Attorney, Agent, or Firm* — Silicon Valley Patent Group LLP; Thomas C. Chan

(57) ABSTRACT

Apparatuses and methods for measuring flicker noise are disclosed. In one embodiment, a noise measurement system may include a first circuit path configured to drive a first terminal of a device under test (DUT) in the noise measurement system, an amplification circuit configured to amplify an output signal of the DUT, a second circuit path configured to drive a second terminal of the DUT, a third circuit path configured to couple a third terminal of the DUT to a circuit ground, and a decoupling circuit configured to decouple the DUT and the amplification circuit, logic configured to detect output signal characteristics of the DUT, logic configured to adjust input impedance of the amplification circuit based on the output signal characteristics of the DUT, and logic configured to measure a flicker noise of the DUT using the amplification circuit with adjusted input impedance.

18 Claims, 16 Drawing Sheets

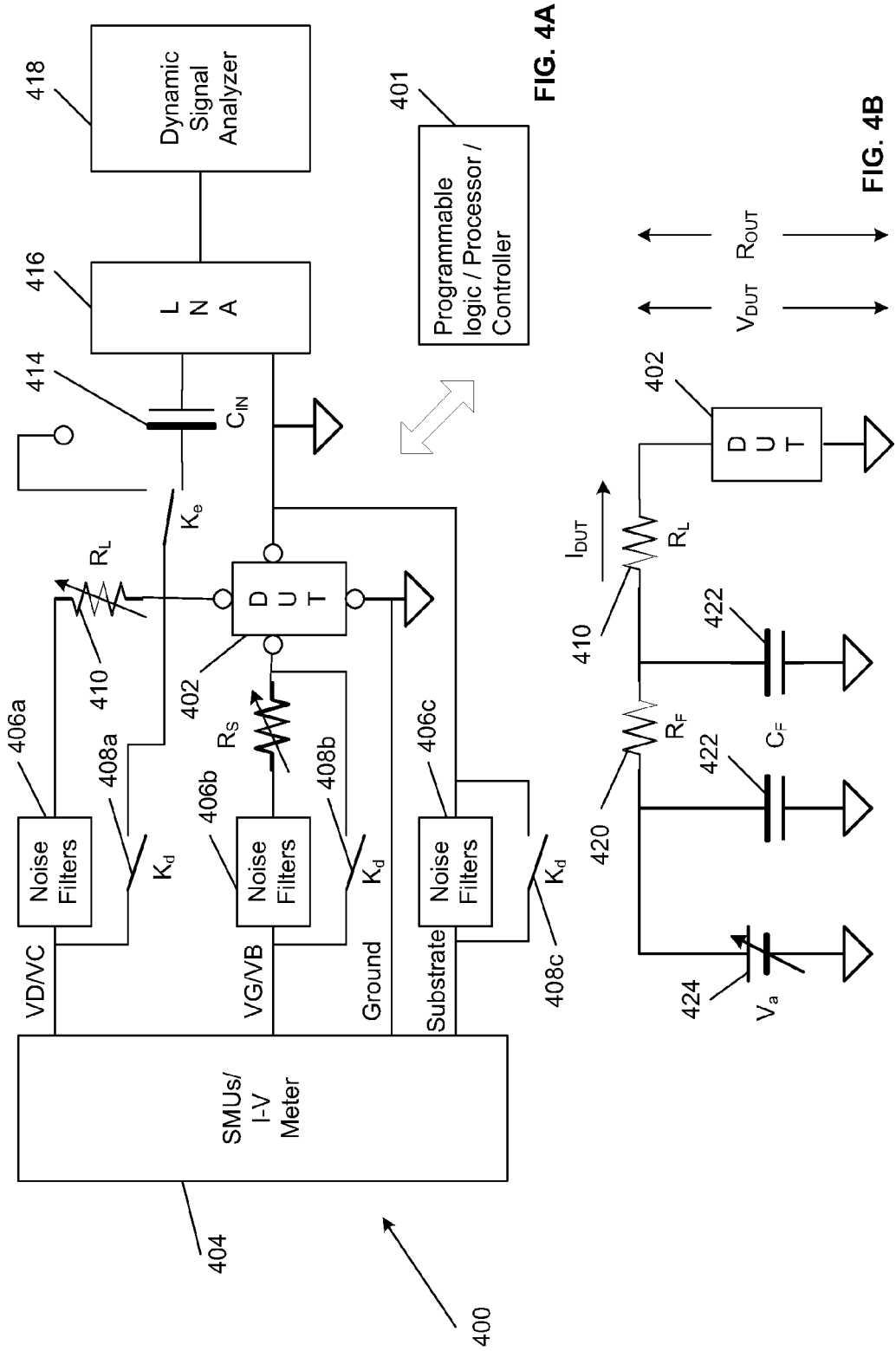

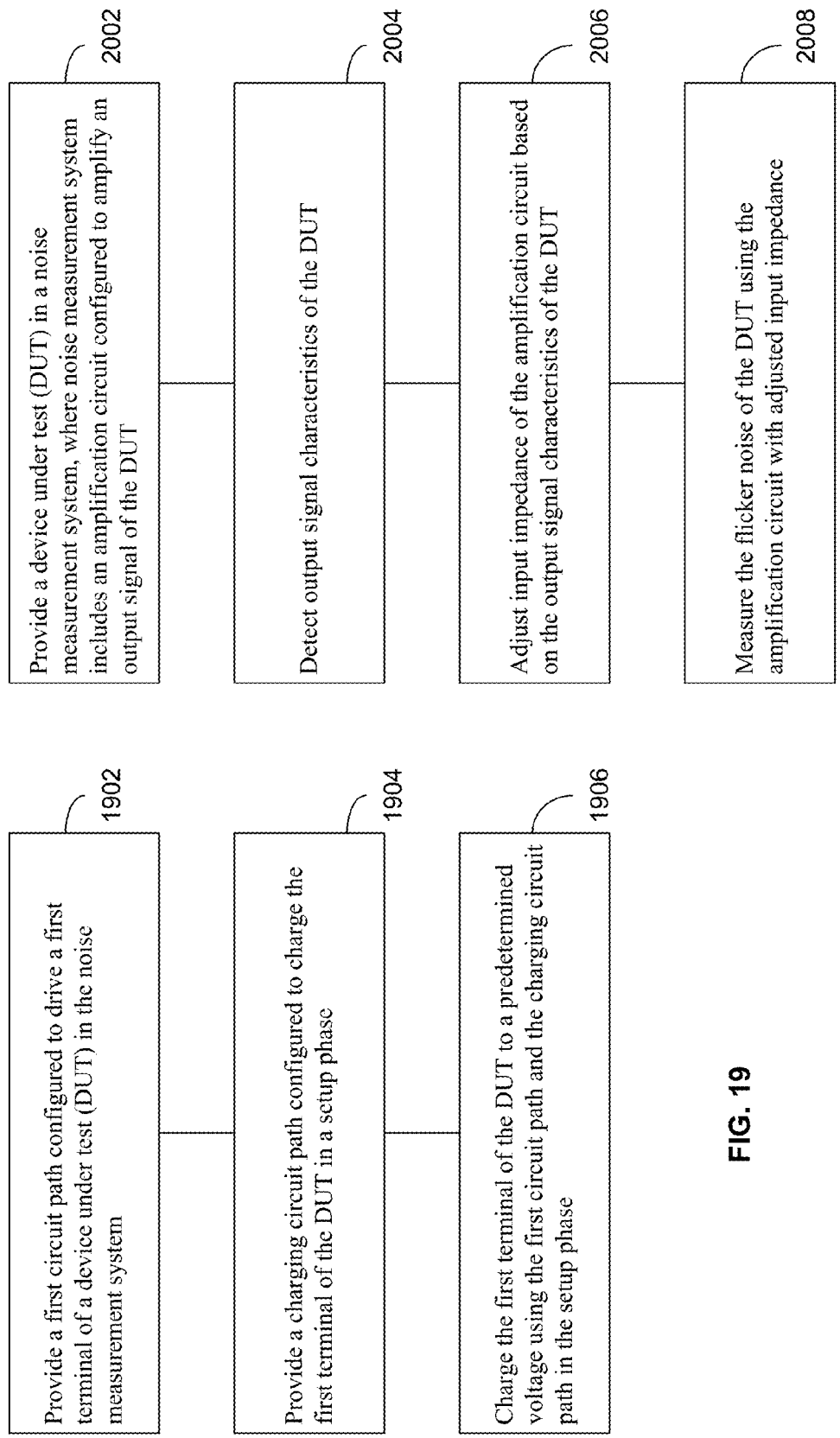

APPARATUSES AND METHODS FOR MEASURING FLICKER NOISE

FIELD

The present disclosure relates to the field of semiconductor design for yield equipment. In particular, the present disclosure relates to apparatuses and methods for measuring flicker noise.

BACKGROUND

Flicker noise, also known as 1/f noise, is an important characteristic for various semiconductor devices, such as MOSFETs, BJTs, JFETs, Diode, and integrated circuit (IC) resistors. Not only does it may directly impact the circuit performance of modern ICs, but also it has been used as an important technique to characterize the manufacturing process quality. On-wafer noise measurement has been done more often in massive volume by semiconductor foundries. SPICE models are built, even with statistical corners, to be distributed to circuit designers to assist them to accurately analyze the impact of noise to circuit performance, especially to RF, low noise, and high-sensitive devices. Accurately measuring flicker noise at wafer level is challenging and time consuming, mostly due to the noisy probing environment, accurate DC bias requirement, and complicated cable connections. Therefore, it is desirable to address the issues of conventional flicker noise measurement systems.

SUMMARY

Apparatuses and methods for measuring flicker noise are disclosed. Flicker noise measurement can be challenging, especially for >1M Hz bandwidth and $<1\times10^{-25}$ $A^2/Hz$ ultra-low noise signals. Due to wide impedance variation for different device under tests (DUTs) and operational conditions with different biases, it can be difficult to use one type of system configuration to measure all of the DUTs, even with programmable load and input resistors, filter time constants, and system gains may help. According to aspects of the present disclosure, a multi-LNA configuration can be used to cover wider range of applications. Such a system has been proven to be efficient and versatile to measure various semiconductor devices. Along with the system resolution, such a system can also balance the efficiency of the measurement and throughput at wafer level, and ease of maintenance. If accuracy and resolution are the main targets, other type of measurement configurations such as correlated noise cancellation techniques may help to further reduce the impact of the LNA noise and enable ultra-low frequency (<0.1 Hz), ultra-low level ($<1\times10^{-26}$ $A^2/Hz$) flicker noise measurement.

In one embodiment, a noise measurement system may include a first circuit path configured to drive a first terminal of a device under test (DUT) in the noise measurement system, a charging circuit path configured to charge the first terminal of the DUT in a setup phase, and logic configured to charge the first terminal of the DUT to a predetermined voltage using the first circuit path and the charging circuit path in the setup phase.

In another embodiment, a method of charging a noise measurement system may include providing a first circuit path configured to drive a first terminal of a device under test in the noise measurement system, providing a charging circuit path configured to charge the first terminal of the DUT in a setup phase, and charging the first terminal of the DUT to a predetermined voltage using the first circuit path and the charging circuit path in the setup phase.

In yet another embodiment, a noise measurement system may include a first circuit path configured to drive a first terminal of a DUT in the noise measurement system, an amplification circuit configured to amplify an output signal of the DUT, a second circuit path configured to drive a second terminal of the DUT, a third circuit path configured to couple a third terminal of the DUT to a circuit ground, and a decoupling circuit configured to decouple the DUT and the amplification circuit, logic configured to detect output signal characteristics of the DUT, logic configured to adjust input impedance of the amplification circuit based on the output signal characteristics of the DUT, and logic configured to measure a flicker noise of the DUT using the amplification circuit with adjusted input impedance.

In yet another embodiment, a method of measuring flicker noise may include providing a DUT in a noise measurement system, where the noise measurement system comprises an amplification circuit configured to amplify an output signal of the DUT, detecting output signal characteristics of the DUT, adjusting input impedance of the amplification circuit based on the output signal characteristics of the DUT, and measuring the flicker noise of the DUT using the amplification circuit with adjusted input impedance.

BRIEF DESCRIPTION OF THE DRAWINGS

The aforementioned features and advantages of the disclosure, as well as additional features and advantages thereof, will be more clearly understandable after reading detailed descriptions of embodiments of the disclosure in conjunction with the non-limiting and non-exhaustive aspects of following drawings. Like numbers are used throughout the figures.

FIG. 4A illustrates yet another flicker noise measurement environment according to aspects of the present disclosure.

FIG. 4B illustrates a drain direct current biasing circuit of FIG. 4A according to aspects of the present disclosure.

FIG. 19 illustrates an exemplary method for charging a noise measurement system according to aspects of the present disclosure.

FIG. 20 illustrates an exemplary method for measuring flicker noise of a device under test according to aspects of the present disclosure.

DESCRIPTION OF EMBODIMENTS

Embodiments of measuring flicker noise are disclosed. The following descriptions are presented to enable any person skilled in the art to make and use the disclosure. Descriptions of specific embodiments and applications are provided only as examples. Various modifications and combinations of the examples described herein will be readily apparent to those skilled in the art, and the general principles defined herein may be applied to other examples and applications without departing from the scope of the disclosure. Thus, the present disclosure is not intended to be limited to the examples described and shown, but is to be accorded the widest scope consistent with the principles and features disclosed herein. The word "exemplary" or "example" is used herein to mean "serving as an example, instance, or illustration." Any aspect or embodiment described herein as "exemplary" or as an "example" in not necessarily to be construed as preferred or advantageous over other aspects or embodiments.

Figure 1:
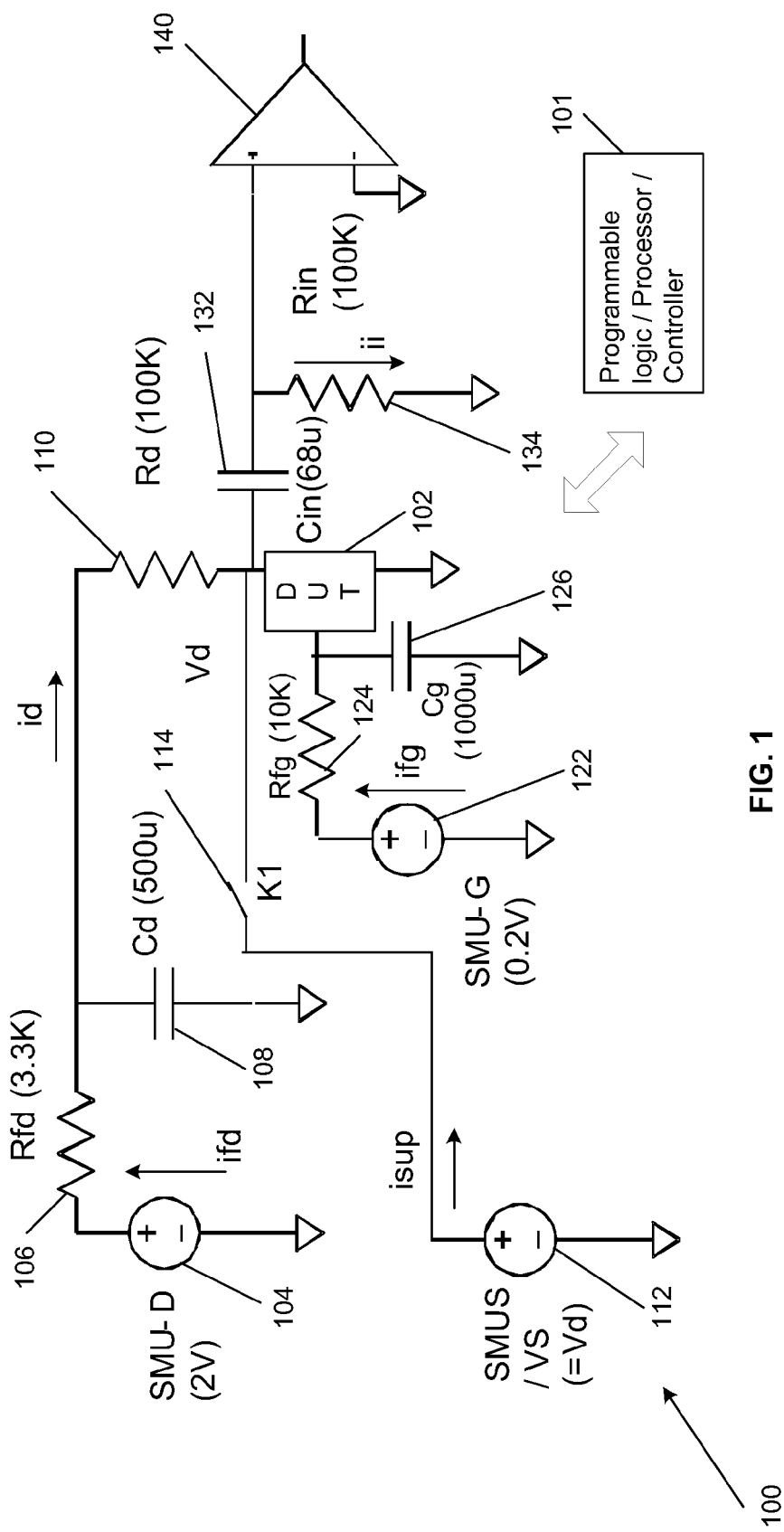
FIG. 1 illustrates an exemplary circuit diagram of a flicker noise measurement apparatus according to aspects of the present disclosure.

FIG. 1 illustrates an exemplary circuit diagram of a flicker noise measurement apparatus according to aspects of the present disclosure. In the example shown in FIG. 1, noise measurements of a device under test (DUT) 102 can be performed by the flicker noise measurement apparatus 100. A first circuit path of the flicker noise measurement apparatus 100 may include a first source measurement unit 104 (SMU-D), resistor 106 (Rfd), capacitor 108 (Cd) and resistor 110 (Rd) coupled to a first terminal of the DUT 102. A charging circuit path of the flicker noise measurement apparatus 100 may include a voltage source 112 (or a second source measurement unit, SMU-S) and a programmable switch 114 (K1) coupled to the first terminal of the DUT 102. A second circuit path of the flicker noise measurement apparatus 100 may include a third source measurement unit 122, as well as resistor 124 (Rfg) and capacitor 126 (Cg) coupled to a second terminal of the flicker noise measurement apparatus 100. A decoupling circuit of the flicker noise measurement apparatus 100 may include capacitor 132 (Cin) and resistor 134 (Rin) which are configured to decouple the DUT 102 and an amplification circuit 140. The flicker noise measurement apparatus 100 includes and is controlled by a programmable logic/processor/controller 101.

In a specific implementation of the flicker noise measurement apparatus 100 of FIG. 1, in the first circuit path, the first source measurement unit 104 (SMU-D) may produce a voltage of 2V, the resistor 106 (Rfd) may be 3.3 kilo ohms, the capacitor 108 (Cd) may be 500 micro farad, and the resistor 110 (Rd) may be 100 kilo ohms. In the second circuit path, the third source measurement unit 122 may produce a voltage of 0.2 V, the resistor 124 (Rfg) may be 10 kilo ohms, and the capacitor 126 (Cg) may be 1000 micro farad. In the decouple circuit, the capacitor 132 (Cin) may be 68 micro farad, and the resistor 134 (Rin) may be 100 kilo ohms.

According to aspects of the present disclosure, the programmable switch 114 (K1) can be configured to connect the voltage source to the first terminal of the DUT during the setup phase and disconnect the voltage source to the first terminal of the DUT during a measurement phase. The charging circuit path has substantially zero impedance when the voltage source is connected to the first terminal of the DUT. In addition, the voltage Vd of the first terminal of the DUT is being observed by monitoring a first current (ifd) in the first circuit path and monitoring a charging current (isup) in the charging path. The flicker noise measurement apparatus 100 determines whether the first terminal of the DUT 102 has reached a predetermined voltage based on the first current and the charging current. After the first terminal of the DUT 102 has reached the predetermined voltage, the flicker noise measurement apparatus 100 may disconnect the charging circuit path in response to the first terminal of the DUT has reached the predetermined voltage.

Figure 2:
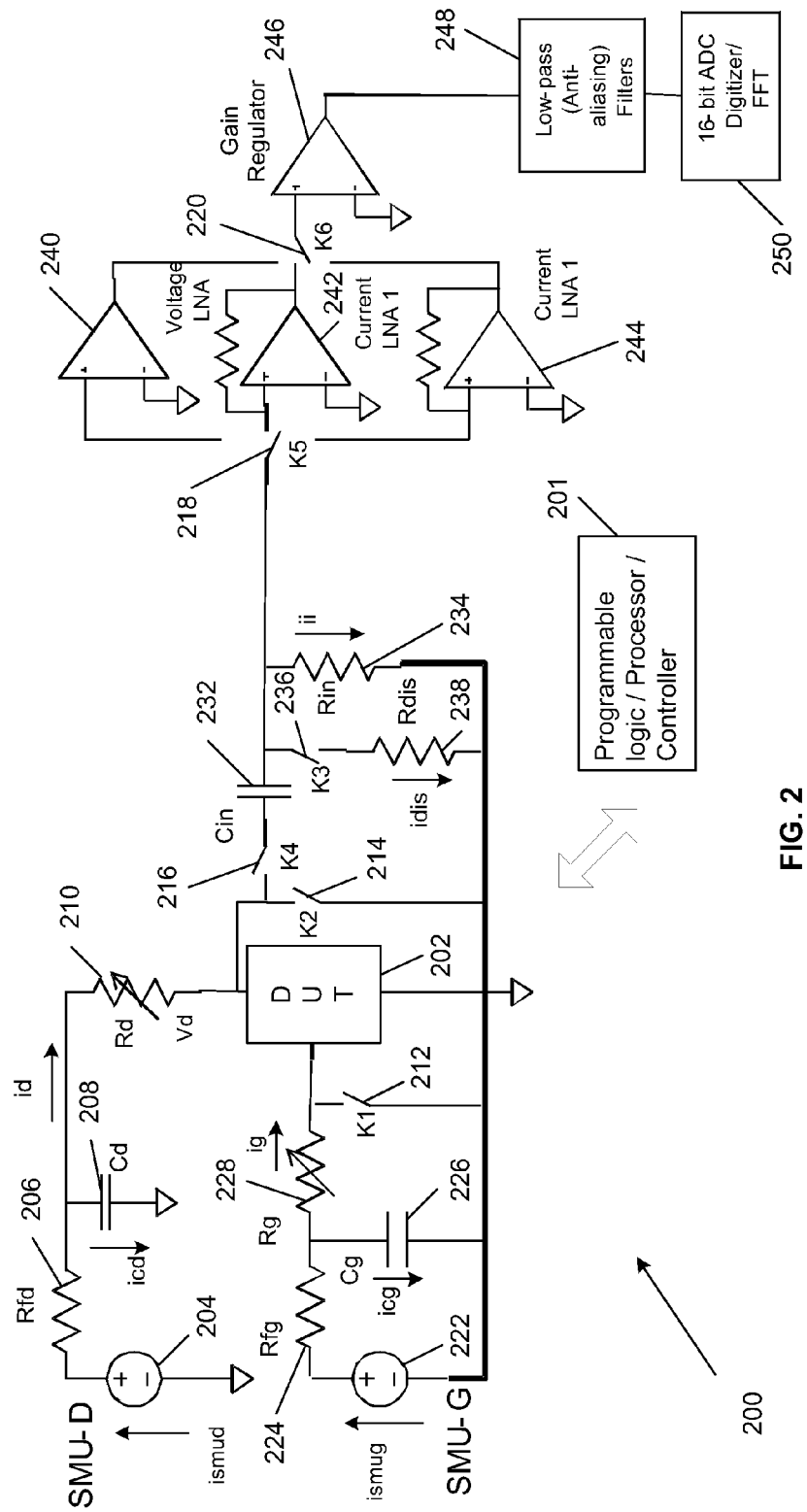
FIG. 2 illustrates another exemplary circuit diagram of a flicker noise measurement apparatus according to aspects of the present disclosure.

FIG. 2 illustrates another exemplary circuit diagram of a flicker noise measurement apparatus according to aspects of the present disclosure. As shown in FIG. 2, noise measurements of a device under test (DUT) 202 can be performed by the flicker noise measurement apparatus 200. A first circuit path of the flicker noise measurement apparatus 200 may include a first source measurement unit 204 (SMU-D), resistor 206 (Rfd), capacitor 208 (Cd), and variable resistor 210 (Rd) coupled to a first terminal of the DUT 202. A second circuit path of the flicker noise measurement apparatus 200 may include a third source measurement unit 222, as well as resistor 224 (Rfg) and capacitor 226 (Cg), as well as variable resistor 228 (Rg) coupled to a second terminal of the DUT 202. A decoupling circuit of the flicker noise measurement apparatus 200 may include capacitor 232 (Cin), resistor 234 (Rin), as well as programmable switch 236 (K3) and resistor 238 (Rdis) in parallel with resistor 234 (Rin), which are configured to decouple the DUT 202 and an amplification circuit. In the particular embodiment shown in FIG. 2, the amplification circuit may include a voltage low noise amplifier (LNA) 240, a first current LNA 242, a second current LNA 244, and a gain regulator 246. The flicker noise measurement apparatus 200 may further include low-pass filters 248 and ADC digitizer or FFT 250. The flicker noise measurement apparatus 200 includes and is controlled by a programmable logic/processor/controller 201.

According to embodiments of the present disclosure, charge built-up (Vd) at the output terminal (also referred to as the first terminal) of the DUT 202 may be discharged through the control of programmable switch 214 (K2) and programmable switch 216 (K4). For example, when K2 is closed and K4 is open, the charge at the output terminal may be discharged to the circuit ground through K2. In some implementations, it is desirable to discharge the output terminal of the DUT 202 before discharging the second terminal of the DUT 202 via the programmable switch 212 (K2). For discharging capacitor 232 (Cin), charges may be discharged through resistor 234 (Rin), shown with discharging current ii. To shorten the discharging time, charges in capacitor 232 (Cin) may be discharged through resistor 238 (Rdis) with programmable switch 236 (K3) closed.

Programmable switch 218 (K5) and programmable switch 220 (K6) may be configured to enable the flicker noise measurement apparatus 200 to adjust input impedance of the amplification circuit based on the output signal characteristics of the DUT. In a particular embodiment, the flicker noise measurement apparatus 200 may be configured to select a first amplifier in a plurality of amplifiers of the amplification circuit (for example select current LNA 242) to be used to measure the flicker noise based on the output signal characteristics of the DUT 202. In addition, the flicker noise measurement apparatus 200 may be configured to detect changes in the output signal characteristics of the DUT 202, select a second amplifier (for example select current LNA 244) in the plurality of amplifiers to measure the flicker noise based on the changes in the output signal characteristics of the DUT 202, and transition from the first amplifier (e.g. current LNA 242) to the second amplifier (e.g. current LNA 244) to measure the flicker noise.

Figure 3:
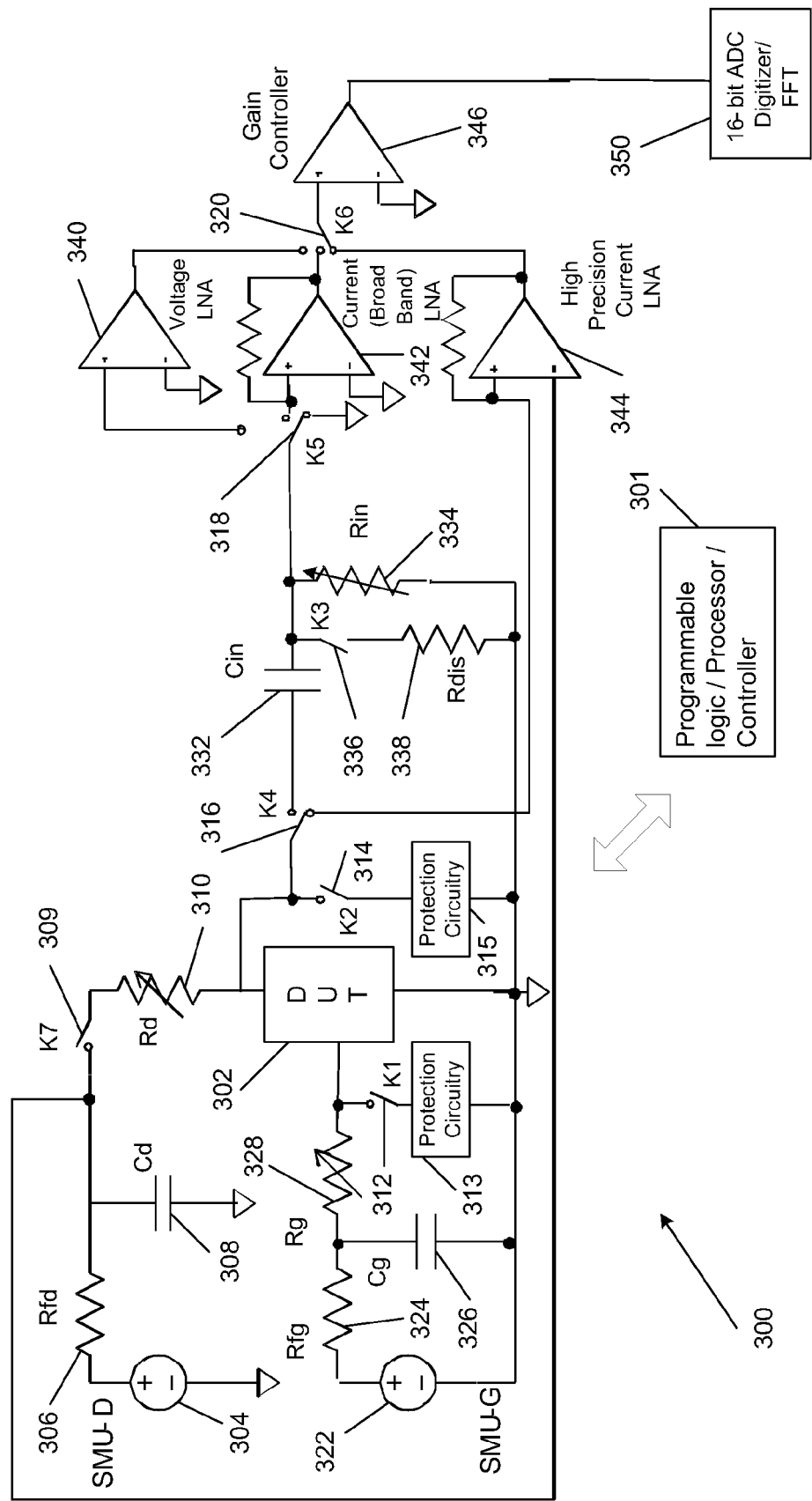
FIG. 3 illustrates yet another exemplary circuit diagram of a flicker noise measurement apparatus according to aspects of the present disclosure.

FIG. 3 illustrates yet another exemplary circuit diagram of a flicker noise measurement apparatus according to aspects of the present disclosure. In the exemplary implementation shown in FIG. 3, noise measurements of a device under test (DUT) 302 can be performed by the flicker noise measurement apparatus 300. A first circuit path of the flicker noise measurement apparatus 300 may include a first source measurement unit 304 (SMU-D), resistor 306 (Rfd), capacitor 308 (Cd), programmable switch 309 (K7), and variable resistor 310 (Rd) coupled to a first terminal of the DUT 302. A second circuit path of the flicker noise measurement apparatus 300 may include a third source measurement unit 322, resistor 324 (Rfg) and capacitor 326 (Cg), as well as variable resistor 328 (Rg) coupled to a second terminal of the DUT 302. A decoupling circuit of the flicker noise measurement apparatus 300 may include capacitor 332 (Cin), variable resistor 334 (Rin), as well as programmable switch 336 (K3) and resistor 338 (Rdis) in parallel with variable resistor 334 (Rin), which are configured to decouple the DUT 302 and the amplification circuit of the flicker noise measurement apparatus 300. In the particular embodiment shown in FIG. 3, the amplification circuit may include a voltage LNA 340, a broadband current LNA 342, a high precision current LNA 344, and a gain controller 346. The flicker noise measurement apparatus 300 may further include ADC digitizer or FFT 350. The flicker noise measurement apparatus 300 includes and is controlled by a programmable logic/processor/controller 301.

According to embodiments of the present disclosure, charge built-up (Vd) at the output terminal (also referred to as the first terminal) of the DUT 302 may be discharged through the control of programmable switch 314 (K2), protection circuitry 315, and programmable switch 316 (K4). For example, when K2 is closed and K4 is open, the charge at the output terminal may be discharged to the circuit ground through K2 and protection circuitry 315. In some implementations, it is desirable to discharge the output terminal of the DUT 302 before discharging the second terminal of the DUT 302 via the programmable switch 312 (K1) and protection circuitry 313. Similar to the description in FIG. 2, for discharging capacitor 332 (Cin), charges may be discharged through resistor 334 (Rin). To shorten the discharging time, charges in capacitor 332 (Cin) may be discharged through resistor 338 (Rdis) with programmable switch 336 (K3) being closed.

Programmable switch 318 (K5) and programmable switch 320 (K6) may be configured to enable the flicker noise measurement apparatus 300 to adjust input impedance of the amplification circuit based on the output signal characteristics of the DUT 302. In a particular embodiment, the flicker noise measurement apparatus 300 may be configured to select a first amplifier in a plurality of amplifiers of the amplification circuit (for example select voltage LNA 340) to be used to measure the flicker noise based on the output signal characteristics of the DUT 302. In addition, the flicker noise measurement apparatus 300 may be configured to detect changes in the output signal characteristics of the DUT 302, select a second amplifier (for example select high precision current LNA 344) in the plurality of amplifiers to measure the flicker noise based on the changes in the output signal characteristics of the DUT 302, and transition from the first amplifier (e.g. voltage LNA 340) to the second amplifier (e.g. high precision current LNA 344) to measure the flicker noise of the DUT 302.

In a particular embodiment of the flicker noise measurement apparatus 300, the decoupling circuit may be bypassed by controlling programmable switch 316 to direct output signals of the DUT 302 to an input of the amplification circuit, for example to a first input of the high precision current LNA 344, directly. A second input of the current LNA 344 may be received from the first circuit path by controlling programmable switch 309 (K7).

According to aspects of the present disclosure, a flicker noise measurement system (also referred to as flicker noise measurement apparatus) may include a low-noise pre-amplifier to amplify the device under test (DUT) noise signal, a dynamic signal analyzer to capture the noise time-domain data and convert them into frequency domain noise data through FFT, and a DC bias system to provide proper biases to DUT. In one approach, battery may be used to bias DUT as it can be sufficiently noise free. However, battery may be difficult to maintain and adapt to the required bias conditions. In an alternative approach, a programmable DC bias supply may be used. In this alternative approach, programmable source measurement units (SMUs) may be employed to bias and measure the current of DUT. Since the SMUs may not be 'quiet' enough for noise measurement, filters may be employed to clean up the residual noises from the DC bias.

FIG. 4A illustrates yet another flicker noise measurement environment according to aspects of the present disclosure. In this example, it shows a diagram of a typical flicker (1/f) noise measurement system 400 for MOSFETs or BJT devices, such as DUT 402. The flicker noise measurement system 400 may include one or more SMUs 404 (or I-V meter) to drive each of the first, second, third, and fourth circuit paths, where each of the circuit paths is coupled to a terminal of the DUT 402. Each of the circuit paths may include one or more noise filters (406a, 406b, and 406c), except the third circuit path, which is the circuit ground. The one or more noise filters may be bypassed by programmable switches (408a, 408b, and 408c), respectively. The flicker noise measurement system 400 includes and is controlled by a programmable logic/processor/controller 401.

In addition to the components listed above, the flicker noise measurement system 400 may include a load variable resistor 410 ($R_L$), an input variable resistor 412 ($R_S$) and a decoupling capacitor 414 ($C_{in}$), which decouples the DUT 402 from low noise amplifier(s) 416. The output of the LNA 416 may be analyzed by a dynamic signal analyzer 418. Programmable switches 408a, 408b, and 408c (Kd) are used to switch between noise and DC measurements. Such a system can be controlled so that the selection of measurement modes, resistors, biases, and filter time constants can be programmable.

FIG. 4B illustrates a drain direct current biasing circuit of FIG. 4A according to aspects of the present disclosure. As shown in FIG. 4B, a diagram that shows the simplified drain DC biasing circuit of FIG. 4A. The bias filter includes resistor 420 ($R_F$) and capacitors 422 ($C_F$). If the leakage current of the filter capacitor is negligible, the DUT bias voltage $V_{dut}$ can be written as $$V_{dut}=V_a-I_{dut}(R_F+R_L), \quad (1)$$

where $R_L$ is the loading resistor, $V_a$ (424) is the output voltage of SMU, and $R_F$ is the filter resistor. To achieve accurate $V_{dut}$, both $I_{dut}$ and $R_F+R_L(=R)$ are desirable be accurate as well. The stabilization of the current $I_{dut}$ may depend on the RC time constant of the filters, while the error of resistance may largely depend on the quality of the resistor and the environment conditions. The total error of $V_{dut}$ can be written as $$\frac{\Delta V_{dut}}{V_{dut}} = -\frac{RI_{dut}}{V_{dut}}\left(\frac{\Delta I_{dut}}{I_{dut}} + \frac{\Delta R}{R}\right), \text{ where, } R = R_L + R_F. \quad (2)$$

The error in $I_{dut}$ may be difficult to mitigate due to the leakage of the filter capacitor (a few tens of nA) and limited charging time in high volume measurement. As a result, a larger value of R (larger $R_L$) can lead to a larger error of $V_{dut}$. A smaller $R_L$ may be chosen to ensure accurate $V_{dut}$. Besides, a shorter filter time constant may be selected as long as the filter low end cut off frequency can be met. To reduce the error induced by the leakage of $C_F$, high quality capacitors may be used.

The filters, $R_L$ and coupling capacitor also determine the time for the system to stable after applying required bias. For efficient measurement, smaller R, smaller $C_F$ and $C_{in}$ may be desired. However, C and R cannot be too small as they may also affect the measurement quality to be discussed in the following sections. The typical time for the system to stabilize after being applied the bias can be between 10 to 100 seconds, mostly depending on the bias condition and measurement accuracy. The overall system stabilization time can be determined by the longest charging time of all the filtered SMU channels. It may take 3-5 τ's (τ=R×C) of the bias system before a reliable noise data can be measured.

According to aspects of the present disclosure, the low noise amplifier in a noise measurement system can be a factor in getting quality data. Both voltage amplifier and current amplifier (a.k.a., trans-conductance amplifier) may be used for low noise measurement. The selection of the amplifiers may depend on the signal nature, and primarily depend on the output impedance of the device under test (DUT). A voltage amplifier can be a better choice for measuring DTU with low output impedance, while a current amplifier can be more suitable for measuring high impedance signals. For example, when measuring MOSFET noise, a current amplifier can be used in sub-threshold and saturation regions where the Rout (1/Gds) may be high, a voltage amplifier can then be chosen for linear (triode) region. Another advantage of using a current amplifier may be its insensitivity to prober noise when doing wafer level measurement due to its low input impedance. As discussed in the next section, the voltage amplifier also has a lower cutoff frequency than the current amplifier when a large $R_L$ is used to measure low level noise. On the other hand, a current amplifier may not work well for low impedance DUT due to its reduced bandwidth and sensitivity. Current amplifiers may also have higher noise at higher frequency as it approaches to the amplifier bandwidth due to LNA parasitic capacitance. In addition to input impedance and bandwidth, LNA noise floor can also be a key consideration. Generally, a voltage LNA can have a lower voltage noise floor, also called input referred noise voltage floor, while a current LNA should have a lower current noise floor. This because that noise voltage can be more sensitive for low impedance DUTs and noise current can be more sensitive for high impedance DUTs.

Figure 4C:
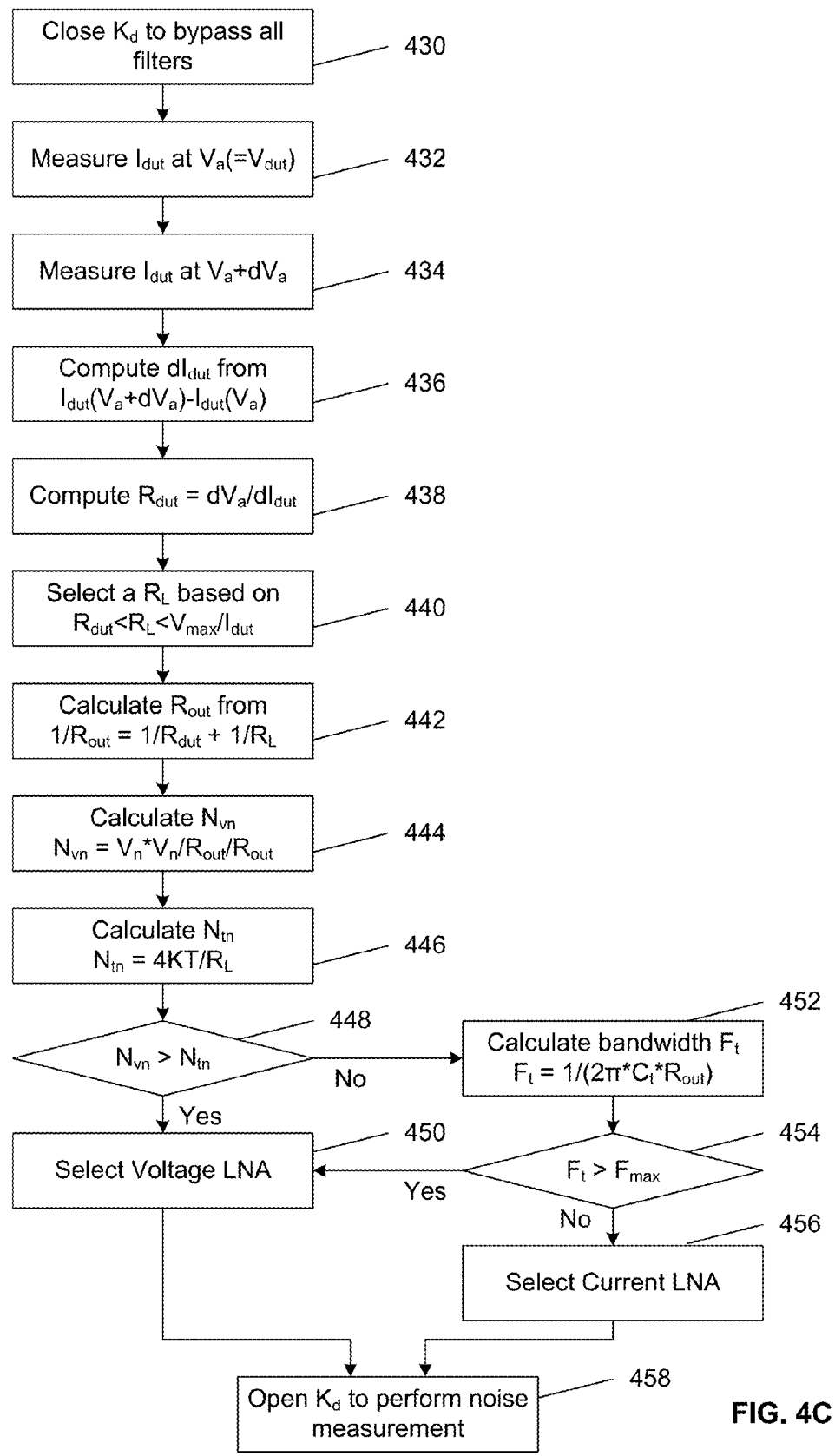
FIG. 4C illustrates an exemplary method to select a low noise amplifier for the system shown in FIG. 4A and FIG. 4B according to aspects of the present disclose.

FIG. 4C illustrates an exemplary method to select a low noise amplifier for the system shown in FIG. 4A and FIG. 4B according to aspects of the present disclose. As shown in FIG. 4C, in block 430, the method closes switches $K_d$ (408a, 408b, and 408c) to bypass all noise filters (406a, 406b, and 406c); and connects switch $K_e$ to open circuit. In block 432, the method measures $I_{dut}$ at $V_a=V_{dut}$. In block 434, the method measures $I_{dut}$ at $V_a+dV_a$, where $dV_a$ may be in the range between 10 to 100 mV in some implementations. In block 436, the method computes d $I_{dut}$ from $I_{dut}(V_a+dV_a)-I_{dut}(V_a)$. In block 438, the method computes $R_{dut}=dV_a/dI_{dut}$. In block 440, the method selects $R_L$ (410) to be in the range of $R_{dut}<R_L<(V_{max}/I_{dut})$. In block 442, the method calculates $R_{out}$ based on $1/R_{out}=1/R_{dut}+1/R_L$. In block 444, the method calculates $N_{vn}$, which is an input referred noise voltage of a voltage LNA, where $N_{vn}=(V_n*V_n)/(R_{out}*R_{out})$. In block 446, the method calculates $N_{tn}$, which is thermal noise of load resistor, using $N_{tn}=4KT/R_L$, where K is the Boltzmann's constant and T is the absolute temperature of the testing environment. In block 448, the method determines whether $N_{vn}$ is larger than $N_{tn}$. If $N_{vn}$ is larger than $N_{tn}$ (448_Yes), the method moves to block 450. In the alternative, if $N_{vn}$ is not larger than $N_{tn}$ (448_No), the method moves to block 452. In block 450, the method selects a voltage LNA to be used for noise measurement. In block 452, the method calculates frequency bandwidth of the noise measurement system $F_t$ based on $F_t=1/(2\pi*C_t*R_{out})$, where $C_t$ is the system parasitic capacitance (also referred to as system tray capacitance). In block 454, the method determines whether $F_t$ is larger than $F_{max}$, where $F_{max}$ is a current LNA's intrinsic bandwidth (also referred to as input open bandwidth). If $F_t$ is larger than $F_{max}$ (454_Yes), the method moves to block 450. Else if $F_t$ is not larger than $F_{max}$ (454_No), the method moves to block 456. In block 456, the method selects a current LNA to be used for noise measurement. In block 458, the method opens switches $K_d$ (408a, 408b, and 408c) and connects switch $K_e$ to $C_{in}$ to perform noise measurement, with either the voltage LNA selected in block 450 or the current LNA selected in block 456. The method of selecting a low noise amplifier ends in block 458.

Figure 5A:
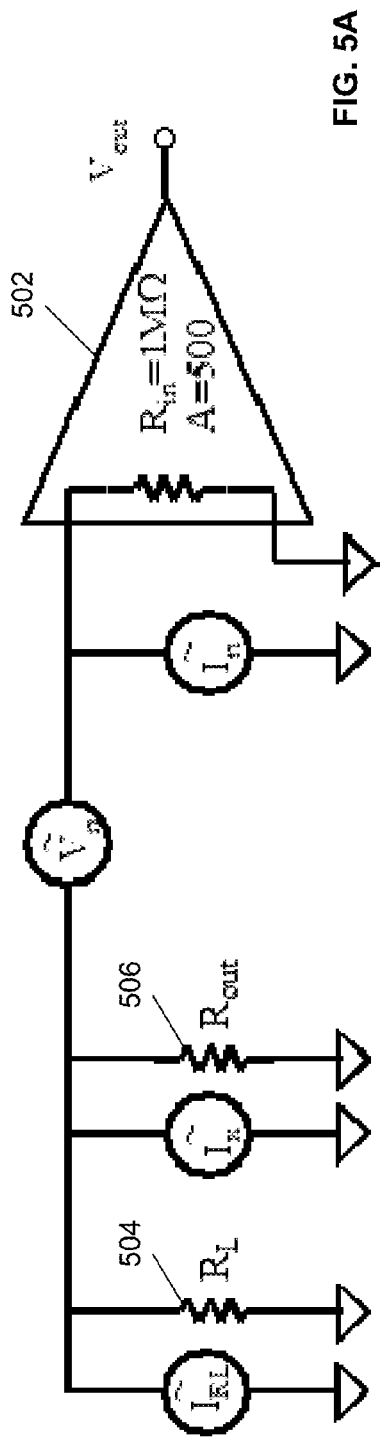
FIG. 5A illustrates a circuit for noise measurement with a voltage amplifier according to aspects of the present disclosure.

FIG. 5A illustrates a circuit for noise measurement with a voltage amplifier according to aspects of the present disclosure. Shown in FIG. 5A is the AC equivalent circuit for an exemplary system when selecting a voltage amplifier. The amplifier 502 has a gain of 500, input impedance of 1MΩ with a noise voltage source, $V_n$ and a noise current source, $I_n$. The loading resistor 504 ($R_L$) is associated with a thermal noise current source, $I_{RL}$. Its value can be expressed as $$I_{RL} = 4kT/R_L, \quad (3)$$

where k is the Bozeman constant and T is the temperature. The DUT is shown in FIG. 5A as a noise current source $I_x$ in parallel with its noiseless output resistor 506 ($R_{out}$). The amplifier's output can be written as $$V_{out}^2 = A^2 R_{ref}^2 \left( I_x^2 + I_n^2 + \frac{4kT}{R_L} \right) + A^2 V_n^2 \left( \frac{R_{in}}{R_{in} + R_L // R_{out}} \right)^2, \quad (4)$$

$$R_{ref} = R_L // R_{out} // R_{in}.$$

For most cases, $R_L \ll R_{in}$ and $R_L \ll R_{out}$, (4) then can be simplified as $$V_{out}^2 = A^2 R_L^2 \left( I_x^2 + I_n^2 + \frac{4kT}{R_L} \right) + A^2 V_n^2. \quad (5)$$

Note that the system resolution is affected by the amplifier's voltage noise floor $V_n^2$, the thermal noise of the loading resistor, $4kTR_L$, and the amplifier's current noise floor $(R_L I_n)^2$. Increasing $R_L$ can eventually make the contribution of $I_x$ a dominant one, provided $I_x \gg I_n$. For example, when $R_L=32K\Omega$, it may generate $3.3\times10^{-16} V^2/Hz$ noise. The contribution of $I_x$ can be at least 3 times larger than that of $I_{RL}$, as long as $I_x^2 > 1\times10^{-24} A^2/Hz > I_n^2$. Namely, the system resolution can be about $1\times10^{-24} A^2/Hz$. Although increasing $R_L$ may further improve system resolution, $I_n$ and other factors, such as the charging time for the coupling capacitor $C_{in}$ and the IR drop on $R_L$, may put an upper limit to $R_L$. Note that, as long as $I_x$'s contribution is larger than those of the thermal noise of $R_L$ and $V_n$, $R_L$ can be as low as possible.

Figure 5B:
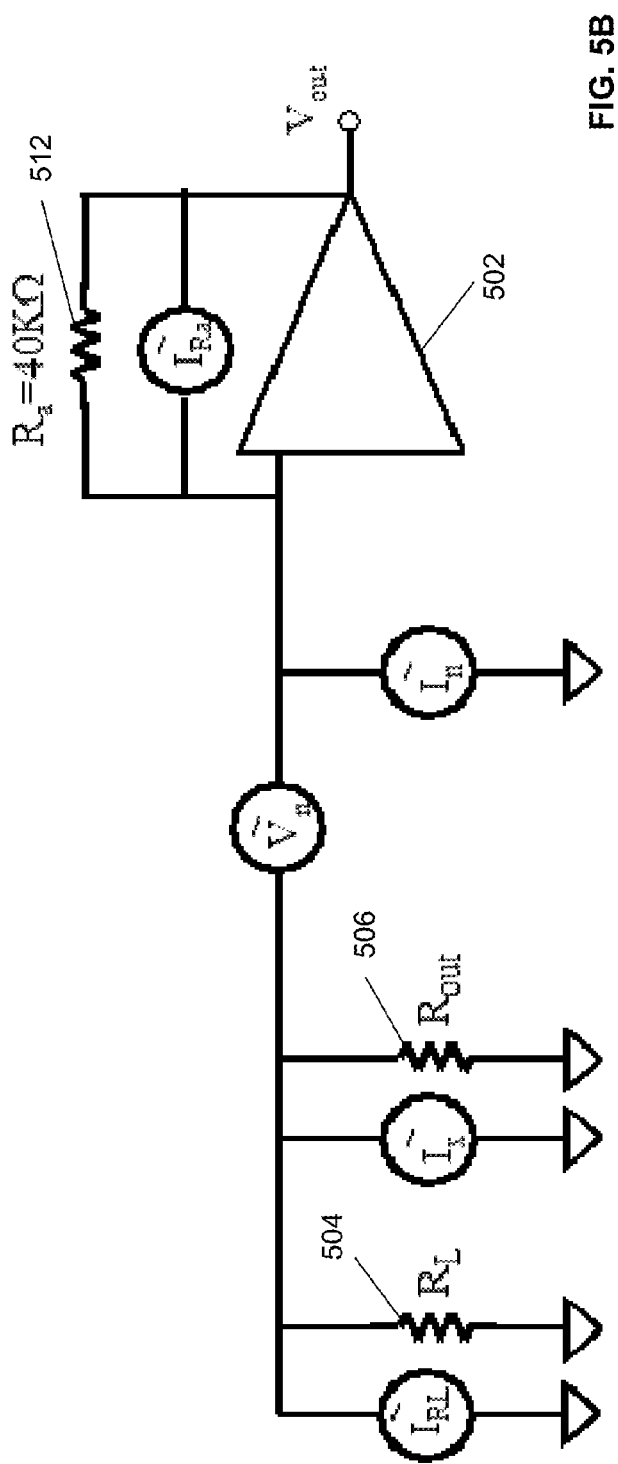
FIG. 5B illustrates an equivalents circuit for noise measurement with a current amplifier according to aspects of the present disclosure.

FIG. 5B illustrates an equivalents circuit for noise measurement with a current amplifier according to aspects of the present disclosure. In this example, when selecting a current amplifier, its AC equivalent circuit is shown in FIG. 5B, where $R_a$ is the feedback resistor 512 of the I-V converter inside the amplifier 502 and $I_{Ra}$ is the thermal noise associated with it. Similarly, the output voltage can be derived as $$V_{out}^2 = R_a^2 \left[ I_x^2 + I_n^2 + 4kT \left( \frac{1}{R_L} + \frac{1}{R_a} \right) + V_n^2 \left( \frac{1}{R_L} + \frac{1}{R_a} \right)^2 \right]. \quad (6)$$

The main factors that control the system resolution would be $R_a$ and $I_n$. Unlike the voltage amplifier, increasing $R_L$ may not significantly improve system resolution. A small $R_L$ can promote the effect of both thermal noise and $V_n$ hence degrade the system noise floor. Therefore, it is desirable for $R_L$ to be as large as possible as long as the DC bias and bandwidth allow. Increasing $R_a$ can improve the system resolution or gain. Changing $R_a$ can be difficult as it may also change system compensation and bandwidth.

Figure 6:
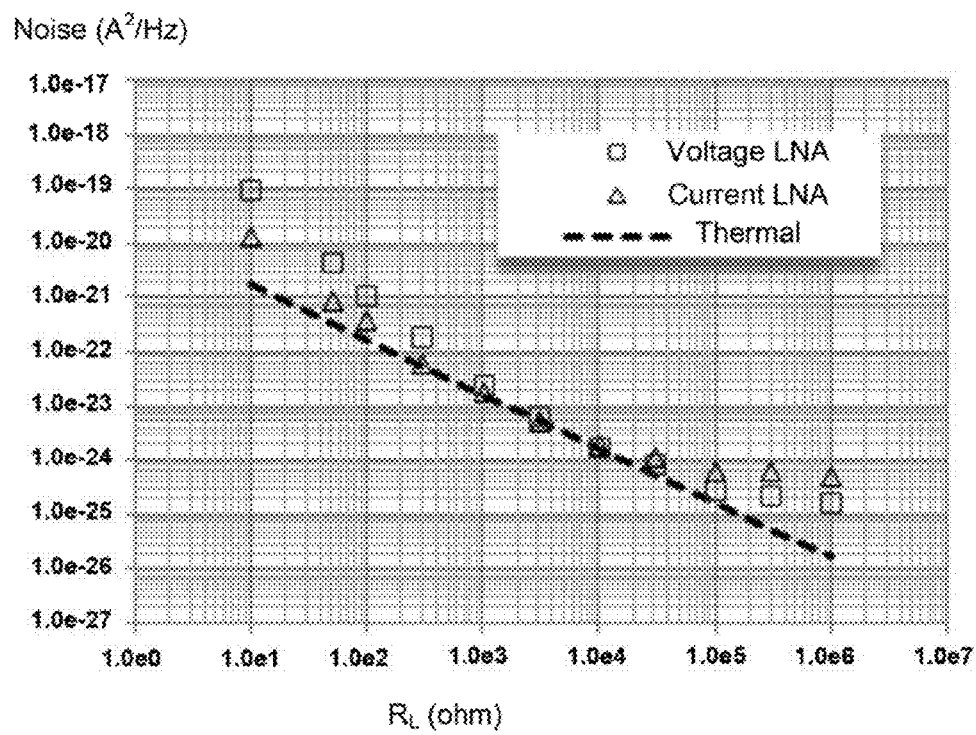
FIG. 6 illustrates a noise measurement of the load resistor of FIG. 4A according to aspects of the present disclosure.

FIG. 6 illustrates a noise measurement of the load resistor of FIG. 4A according to aspects of the present disclosure. The LNA noise, DUT impedance, and LNA parameters, such as $R_{in}$ and $R_a$, as well as the load resistor can contribute to the system resolution. Since $R_{in}$ and $R_a$ may not be controlled by a user, one important factor can be the selection of the load resistor $R_L$ based on the DUT impedance and LNA noise floor. To illustrate the LNA noise and its relationship to DUT impedance and/or load resistor $R_L$, The measured resistor noise data is shown in FIG. 6. In this plot, all resistors can be low-noise metal film resistors. The system employs a similar set up as the one shown in FIG. 4A, without connecting a DUT, to measure the noise of the load resistor $R_L$. Also shown in FIG. 6 is the theoretical thermal noise of the resistors. It can be seen that the measured resistor noise may deviate from the thermal noise value when $R_L$ is low due to the noise voltage of the LNAs. The measured noise may also deviate from the thermal noise of $R_L$ at high $R_L$ value due to the thermal noise contribution of the input resistance of $R_{in}$ for the voltage LNA, or of the feedback resistor $R_a$ for the current LNA. Additionally, the current noise of the LNAs can also contribute to the measured data when $R_L$ or $R_a$ value is large. Note that when $I_n$ is higher than DUT noise, increasing $R_L$ or $R_a$ may not help to improve the noise resolution. From FIG. 6, both voltage and current noise of the LNAs can be extracted, and the measured data can be corrected as shown in FIG. 7.

Note that when DUT impedance is in the range of 1K-10K ohm, both LNAs produce results that can match the theoretical results and no corrections may be needed. When DUT impedance is lower than 300 ohm, $V_n$ can be the main limiting factor for the system resolution. On the other hand, $I_n$, $R_L$, $R_{in}$ and $R_a$ can be configured to set the system resolution when DUT impedance is higher than 30K ohm. In addition, operations at low $V_n$ may not be important for most semiconductor devices, such as MOSFETs or BJTs as their noise level can be higher than the resolution set by $V_n$ when their output impedance may be low. While their noise may be low, their impedance may also be high, for example, in the order of 50K to 500K ohm range. Since a well-designed LNA may have low $I_n$ (in the order of tens of fA range) and $R_{in}$ and $R_a$ may be determined by the LNAs, the system resolution can be determined by $R_L$ and its parallel DUT impedance.

Figure 7:
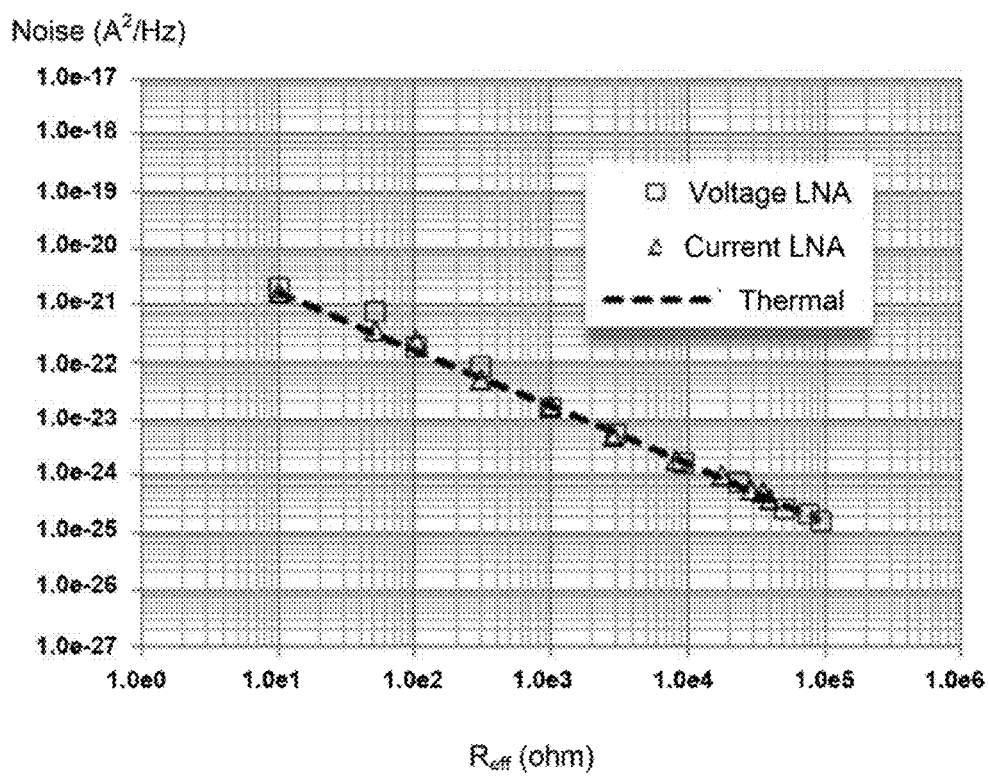
FIG. 7 illustrates a corrected noise measurement of the load resistor of FIG. 4A according to aspects of the present disclosure.

FIG. 7 illustrates a corrected noise measurement of the load resistor of FIG. 4A according to aspects of the present disclosure. In this example, $R_{eff}$ is $R_L$ in parallel with $R_{in}$ for voltage LNA or with $R_a$ for current LNA. $V_n=2.8$ nV/√Hz, $I_n=50$ fA, $R_{in}=100K$ for voltage LNA; $V_n=1.2$ nV/√Hz, $I_n=80$ fA, $R_a=40K$ for current LNA.

For example, when DUT impedance is 3K and the LNA voltage noise $V_n=3$ nV/√Hz, LNA noise contribution can be $1\times10^{-24}$ A²/Hz (=$V_n^2/R^2$). This number may already be lower than the thermal noise of a 3K load resistor $R_L$, which can be $6\times10^{-24}$ A²/Hz (=4 KT/$R_L$). Further reducing $V_n$ may not improve system resolution.

Figure 8:
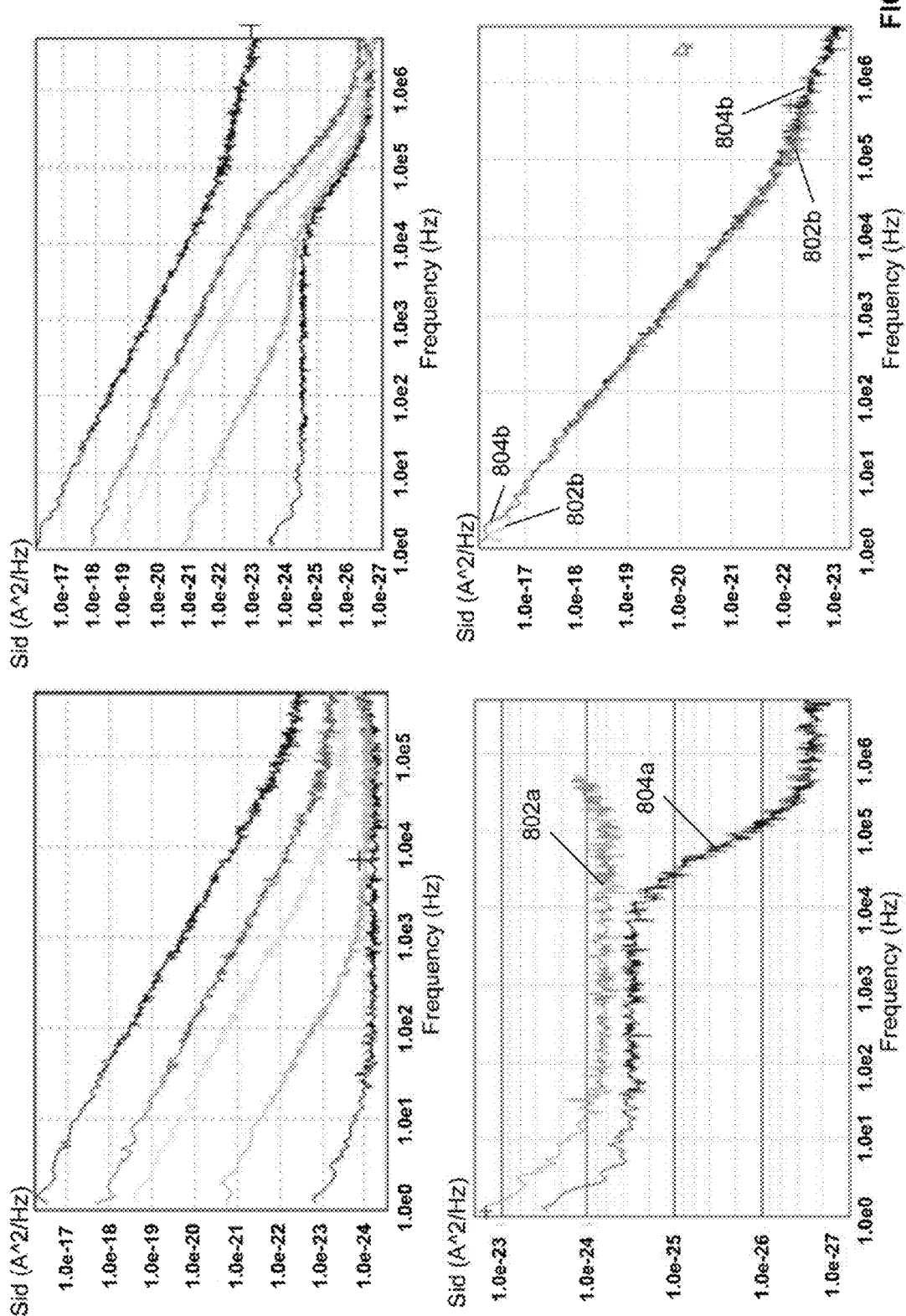
FIG. 8 illustrates exemplary noise measurements of a pMOSFET device according to aspects of the present disclosure.

FIG. 8 illustrates exemplary noise measurements of a pMOSFET device according to aspects of the present disclosure. In this example, a pMOSFET may be biased from weak inversion to saturation. From this example, one may observe two major differences. One is the voltage amplifier has better accuracy when the MOSFET impedance is high as $R_L$ can effectively increase the system resolution for a voltage LNA while the current LNA resolution may be clamped by the thermal noise of $R_a$. Another difference is the current amplifier has better system bandwidth when DUT impedance and $R_L$ are both high.

As shown in FIG. 8, pMOSFET noise may be measured from weak inversion to saturation by a current LNA (top left) and a voltage LNA (top right). From the lowest to the highest curves for the top 2 plots, drain current increases with Vg from 20 nA to 2.8 mA. Output resistance reduces from $5 \times 10^9$ to $1.2 \times 10^3$ ohm. The direct comparison is shown in the 2 lower plots. The left is for the lowest drain current and highest output resistance. The right is for the highest drain current and lowest output resistance. For the lowest drain current, significant differences may be noted between the 2 LNAs. The curves 802a and 802b are results from a current LNA. Its resolution may be limited by the floor noise of the LNA and $R_a$ when current is low and output resistance is high. Curves 804a and 804b are results from a voltage LNA, which may be more accurate as its resolution can be governed by the $R_{in}$ and load resistor $R_L$. At high Vg where DUT output impedance may be low, both LNAs yield substantially similar results as both resolution may be similarly limited by the load resistor $R_L$.

Figure 9:
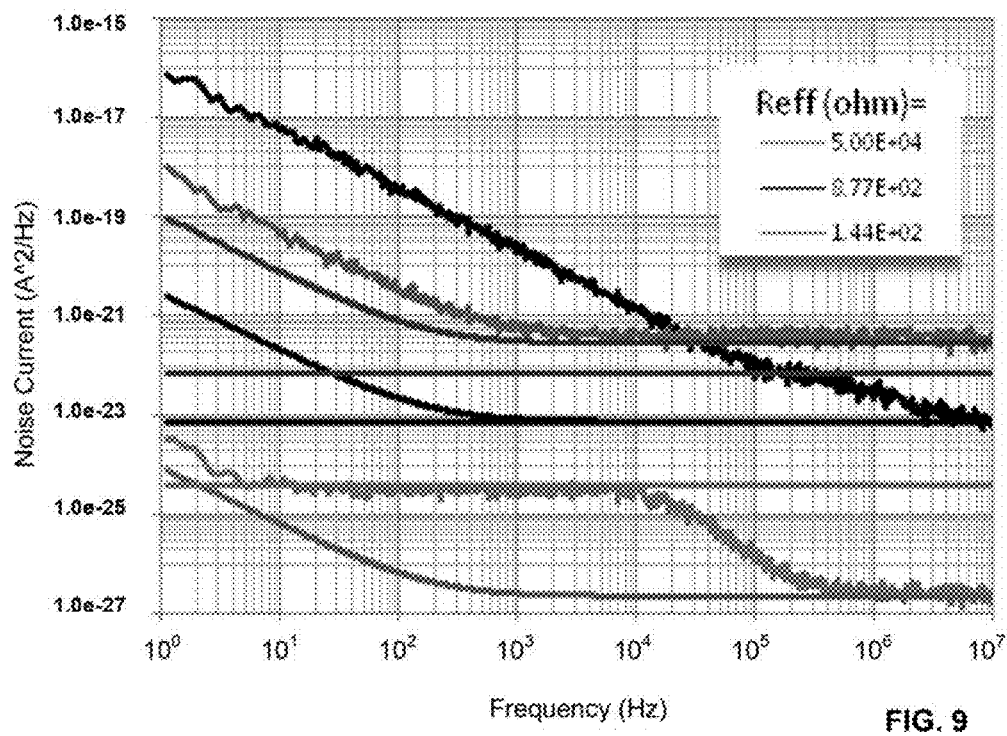
FIG. 9 illustrates exemplary noise measurements of a MOSFET device by a voltage low noise amplifier at various bias conditions according to aspects of the present disclosure.
Figure 10:
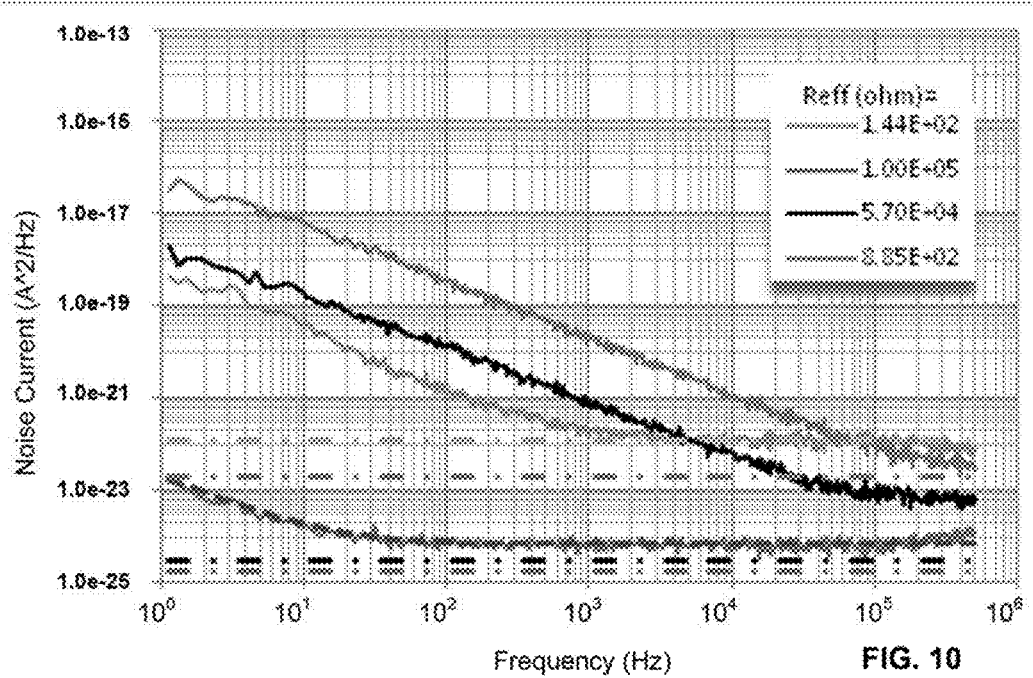
FIG. 10 illustrates exemplary noise measurements of a MOSFET device by a current low noise amplifier at the same various bias conditions of FIG. 9 according to aspects of the present disclosure.

A direct comparison between measured DUT noise and LNA noise floor as shown in FIG. 9 for a voltage LNA and in FIG. 10 for a current LNA may further illustrate the relationship between the LNA noises versus system resolution, as well as their relationship with DUT impedance and load resistor $R_L$. The $R_{eff} = R_{out}//R_L$, where $R_{out}$ is the DUT output impedance. As illustrated in FIG. 7, the voltage LNA noise may be lower than the DUT noise, as long as $R_{eff}$ is larger than 300 ohm. When DUT impedance is high, the system resolution is actually controlled by the thermal noise of $R_L$. These results are consistent with the results shown in FIG. 6 and FIG. 7. For the situation of current LNA, the system resolution may be controlled either by the thermal noise of $R_L$ or by the current noise floor of the LNA, depending on which one is higher.

FIG. 9 illustrates exemplary noise measurements of a MOSFET device by a voltage low noise amplifier at various bias conditions according to aspects of the present disclosure. As shown in FIG. 9, a MOSFET noise measured by a voltage LNA (solid lines) at different bias conditions. Also shown are the LNA floor noise generated noise current on the DUT output impedance $R_{out}$ and load resistor $R_L$ (dash lines). Reff=$R_{out}//R_L$ is also listed in the legend. Note that as long as Reff is large enough, the LNA noise contribution can be lower than the DUT noise before the system starts to roll off due to parasitic capacitance of the system. Thermal noise of the $R_L$ is shown as dash-point lines.

FIG. 10 illustrates exemplary noise measurements of a MOSFET device by a current low noise amplifier at the same various bias conditions of FIG. 9 according to aspects of the present disclosure. As shown in FIG. 10, MOSFET noise measured by a current LNA (solid lines) at the same bias conditions as in shown in FIG. 9. Also shown are the LNA floor noise (dash lines). Reff=$R_{out}//R_L$ is also listed in the legend. The lowest DUT noise can be limited by the LNA noise. While the thermal noise of $R_L$ sets the system resolutions as shown in dash-point.

Figure 11:
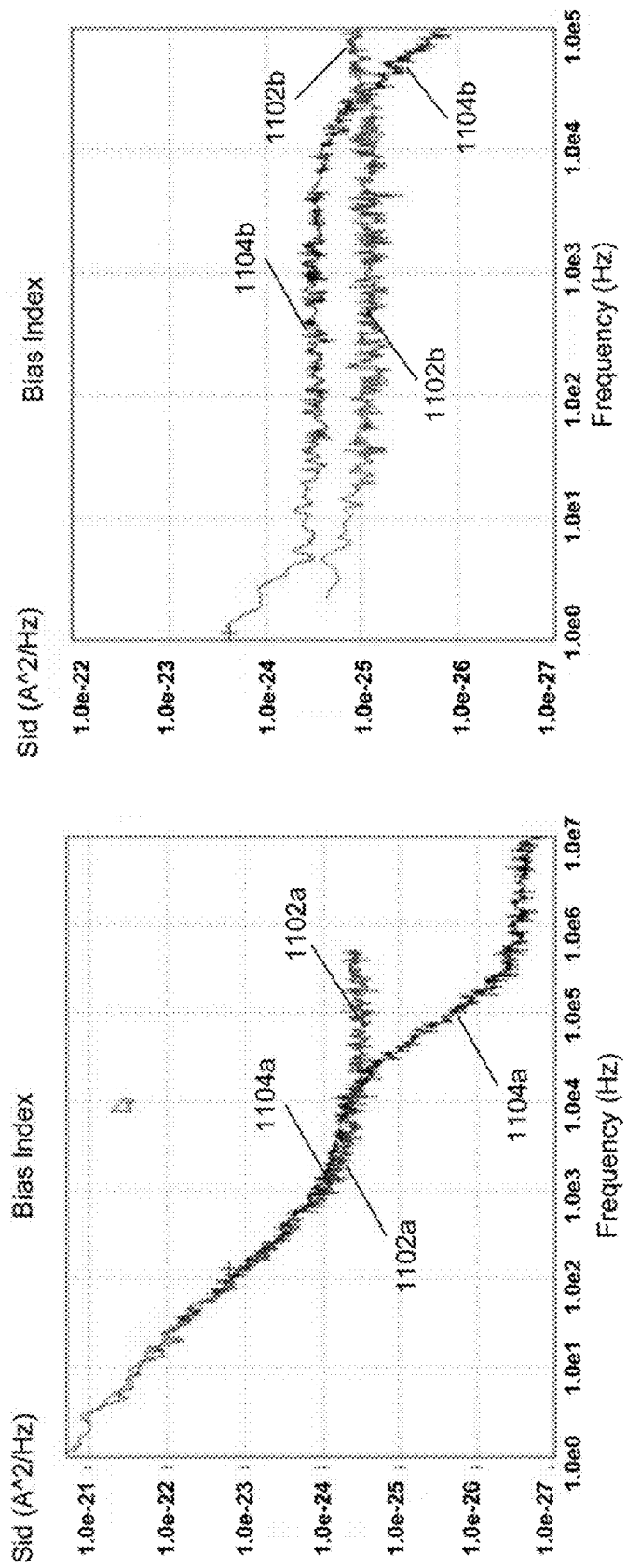
FIG. 11 illustrates a comparison of noise measurements of the MOSFET device by a voltage LNA and a current LNA according to aspects of the present disclosure.

From above discussions, it is noted that increasing $R_L$ for high impedance DUT (high $R_{out}$) can increase the system resolution. However, it is limited by the LNA noise floor and input impedance as those parameters also need tradeoffs to meet wide bandwidth requirement. A multi-amplifier configuration may be used in order to meet the different measurement conditions and requirements. For example, in order to further improve the high-impedance resolution shown in FIG. 8, a high-precision current LNA can be used to achieve an improved resolution as shown in FIG. 11. While this LNA may have 8 times better resolution than that shown in FIG. 8, its bandwidth may be reduced in comparison with that used in FIG. 8. It may still have significantly wider system bandwidth compared with the voltage amplifier at high impedance situation as the current LNA may be less sensitive to the parasitic capacitance of the prober cables and test fixtures as discussed in the following sessions.

FIG. 11 illustrates a comparison of noise measurements of the MOSFET device by a voltage LNA and a current LNA according to aspects of the present disclosure. As shown in FIG. 11, a comparison of the MOSFET noise measured by a voltage LNA and a high-precision current LNA. The intrinsic bandwidth of this current LNA is 1 MHz and hence lower than that of the voltage LNA (10 MHz). However, the current LNA shows better system resolution and system bandwidth as it is less sensitive to the parasitics from the cable and test fixtures. The left figure shows the current LNA (shown by plot 1102a) does not roll off until 500 KHz, while the voltage LNA (shown by plot 1104a) rolls off at 10 KHz. The right figure shows this high precision current LNA (shown by plot 1102b) has a noise current resolution of $<8 \times 10^{-26}$ $A^2/Hz$, while the voltage LNA (shown by plot 1104b) noise current resolution is about $2 \times 10^{-25}$ $A^2/Hz$.

One observation to LNA noise can be that it is also a strong function of frequency at lower frequency. This is because the LNA noise includes both white noise and 1/f noise. The 1/f and white noises may meet at a frequency which is referred to as the 1/f noise corner frequency of the LNA, $f_c$. $f_c$ can be an important parameter for a high-quality LNA, not only because it may be difficult to lower $f_c$, but also the LNA noise may rapidly increase when frequency reduces beyond it. However, most of the conventional noise measurement systems have not given the corner frequency but only the white floor noise at frequency range of 10K Hz.

Figure 12:
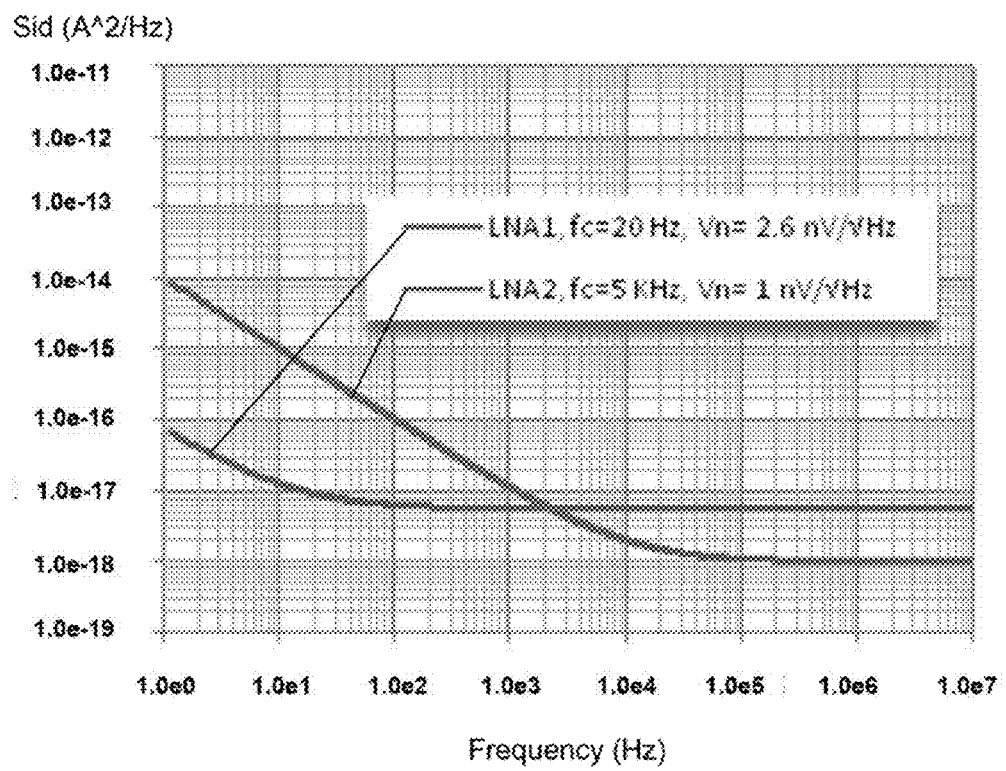
FIG. 12 illustrates a comparison of noise measurements by two voltage LNAs according to aspects of the present disclosure.

FIG. 12 illustrates a comparison of noise measurements by two voltage LNAs according to aspects of the present disclosure. The example in FIG. 12 shows the impact of different LNA noise shapes to DUT noise measurement resolution. In this example, the LNA1 has lower $f_c$ but higher white floor noise than LNA2. Without examining the $f_c$, one may mistakenly believe that LNA2 may be a better choice for low noise measurement. However, this may be true if the frequency of interest is in the frequency range above the $f_c$ of LNA2, i.e., 5K Hz, in this case. When a frequency of interest is lower than $f_c$ of LNA2, the noise of LNA1 can be lower than LNA1 due to its lower $f_c$. Hence, for the interests of measuring low frequency flicker noise, LNA1 can be a better choice than LNA2 even its white noise may be higher. On the other hand, if only white noise of low impedance DUT is to be measured, for instance thermal noise of a film resistor, LNA2 would have a better resolution. This advantage may be reduced if the DUT impedance is high hence the load resistor $R_L$ value can also be set higher. The system gain may increase with $R_L$ and eventually override the LNA noise. Of course, it would be desirable to get a LNA that has both a low white floor noise and low corner frequency at the same time.

As shown in FIG. 12, noise comparison between 2 voltage LNAs. LNA1 can be more suitable for flicker noise measurement at lower frequency for low impedance DUT due to its lower 1/f corner frequency $f_c$, even LNA2 may have lower white noise floor. The shade area is where LNA2 fails to measure DUT noise while LNA1 can still do.

Figure 13:
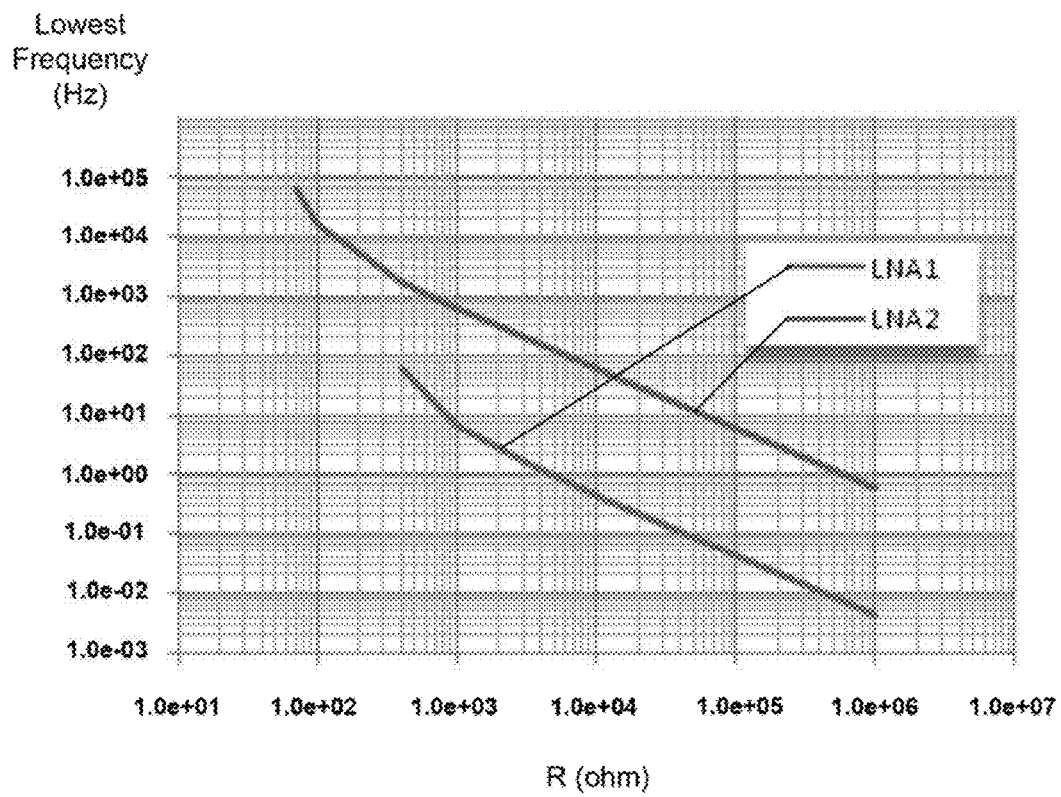
FIG. 13 illustrates another comparison of noise measurements by the two voltage LNAs of FIG. 12 according to aspects of the present disclosure.

FIG. 13 illustrates another comparison of noise measurements by the two voltage LNAs of FIG. 12 according to aspects of the present disclosure. As shown in FIG. 13, the comparison of the 2 LNAs shown in FIG. 12 for their lowest frequency at which DUT noise can be measured as a function of DUT impedance R. This graph shows that the LNA1 can measure lower frequency at same DUT impedance than LNA2.

The lowest frequency at which the DUT noise can be measured may depend on DUT impedance because the impact of the LNA noise to system resolution may be diminished with the increase of DUT impedance. Since $R_L$ can be selected to match the output impedance of DUT, with the increase of DUT impedance, higher $R_L$ value can also help to improve the system resolution. FIG. 13 illustrates a comparison of the two LNAs used in FIG. 12 for the lowest frequency where DUT noise can be measured versus DUT impedance.

Note that traditionally, 1/f or flicker noise measurements may be done mostly in the frequency range from 1 to 100 KHz. There are also reports that have shown data measured at 0.01 to 1 Hz range. As circuit designers want to know the corner frequency where the 1/f noise merged with the white thermal noise, it can be beneficial to extend flicker noise measurement to higher frequency range.

Firstly, note that the noise measurement system shown in FIG. 4A, where there are 2 key components that may be essential for extending the noise measurement to a higher frequency. One is the DSA and another is the LNA. Most the off-shelf commercial DSAs can only measure noise spectrum up to 100 KHz due to the ADC sampling rate and on board memory limitations. However, these difficulties can be overcome by the availability of the high-speed ADC digitizers that can be installed into a PC computer and integrated with analytical software for post signal processing. According to aspects of the present disclosure, using an ADC digitizer with a PC post processing not only may reduce the cost of the whole system, but may also significantly improve the overall system efficiency and data quality due to the real time one-shot data capture and efficient post process of the powerful PC system. At 16 bit of analog to digital resolution, the output of the LNA can be digitized continuously for many tens of seconds at a sampling rate of tens of megahertz and saved in the on board memory. Advance FFT analysis can be done for this vast amount of data efficiently with better resolution and faster speed than any off-shelf DSA. This can extend the DSA capability to 50 MHz.

Secondly, the bandwidth of the LNA can be configured to cover wider frequency range. As described above, it is desirable for the LNAs used for noise measurement to have low noise, both in voltage and current, but also to have broad band and with high dynamic range and wide impedance match capability. To design a low noise LNA that can meet these requirements at the same time can be challenging. In addition, most of wideband LNA noise may increase significantly towards the bandwidth boundaries, both in the lower and higher ends of the operating frequencies. According to aspects of the present disclosure, making a wideband voltage LNA can be technically easier but less useful due to its high sensitivity to the cable and tray parasitic capacitance for high impedance measurement. The current LNA however, may be more favorable for high-impedance wideband noise measurement when connecting to a wafer prober for wafer-level DUT measurements. Hence, just increasing the bandwidth of the LNAs may not be enough. More thorough considerations for the overall system parasitic are more important. As described in association with FIG. 8 and FIG. 9, when high DUT impedance and hence high $R_L$ are presented, the noise data measured by a voltage LNA can roll off at certain frequency lower than those measured by a current LNA.

Due to the existence of the tray and cable capacitances between the amplifier and the DUT, the RC time constant of the input nodes can determine the higher end cutoff frequency of the system, not the amplifier itself. This is extremely true when performing on-wafer noise measurement where the long cable, probe tips and wafer chuck can increase parasitic capacitance. The cutoff frequency $f_T$ can be calculated from the total parasitic capacitance, $C_T$, the loading resistor, $R_L$, and the input impedance of the amplifier, $R_{in}$, and the output impedance of the DUTs, $R_{out}$, $$f_T = \frac{1}{2\pi C_T R_{in} // R_L // R_{out}}. \quad (7)$$

Therefore, a large $R_{out}$ and matching $R_L$ can lead to a lower $f_T$. Since the $R_{in}$ of the voltage amplifier may usually be larger than that of a current amplifier, the voltage amplifier may have an even lower $f_T$ than the current amplifier for high $R_{out}$ and $R_L$ values. However, as the decision of choosing $R_L$ may also be affected by other factors, such as the lowest noise level of the DUTs to measure and amplify noise floor as discussed in previous sections.

Figure 14:
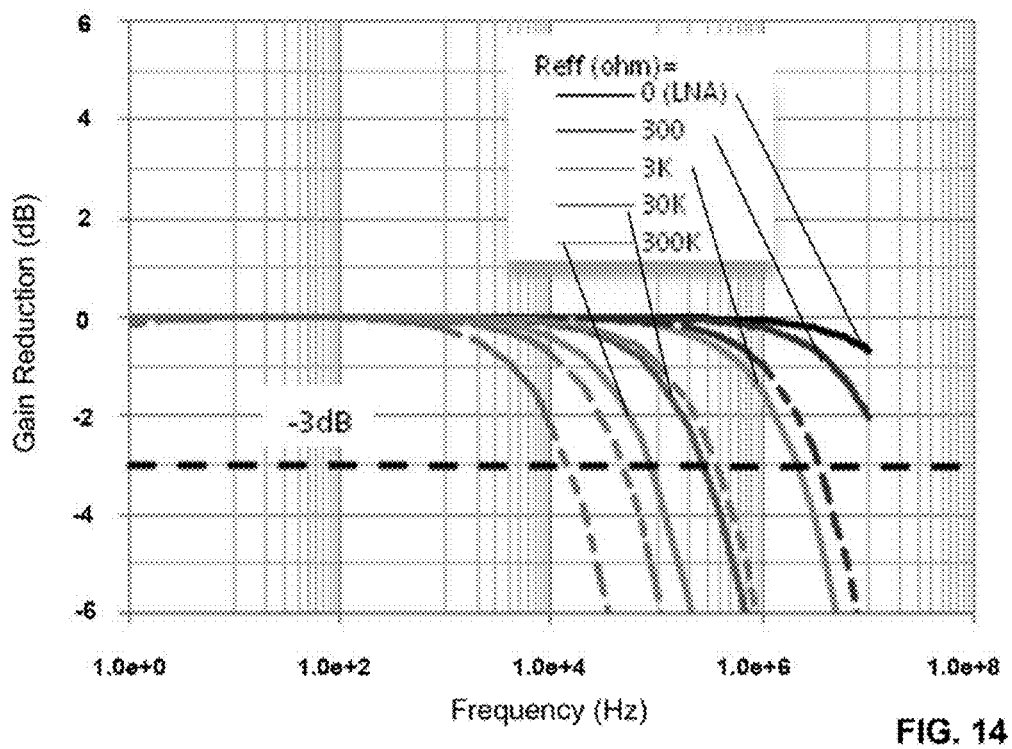
FIG. 14 illustrates impact of load resistance to a noise measurement system using a voltage LNA according to aspects of the present disclosure.

FIG. 14 illustrates impact of load resistance to a noise measurement system using a voltage LNA according to aspects of the present disclosure. The example of FIG. 14 illustrates effects of $R_{eff}(=R_L//R_{out})$ to the system bandwidth of a voltage LNA. Also shown is the voltage LNA bandwidth when $R_L=0$. Note that the system bandwidth may mainly be restricted by the parasitic capacitance and the effective DUT resistance $R_{eff}$ ($R_{out}//R_L$). Also, while selecting high $R_L$ for high impedance DUT can increase the system resolution for noise measurement, it may also greatly degrade the bandwidth of the overall system gain.

Figure 15:
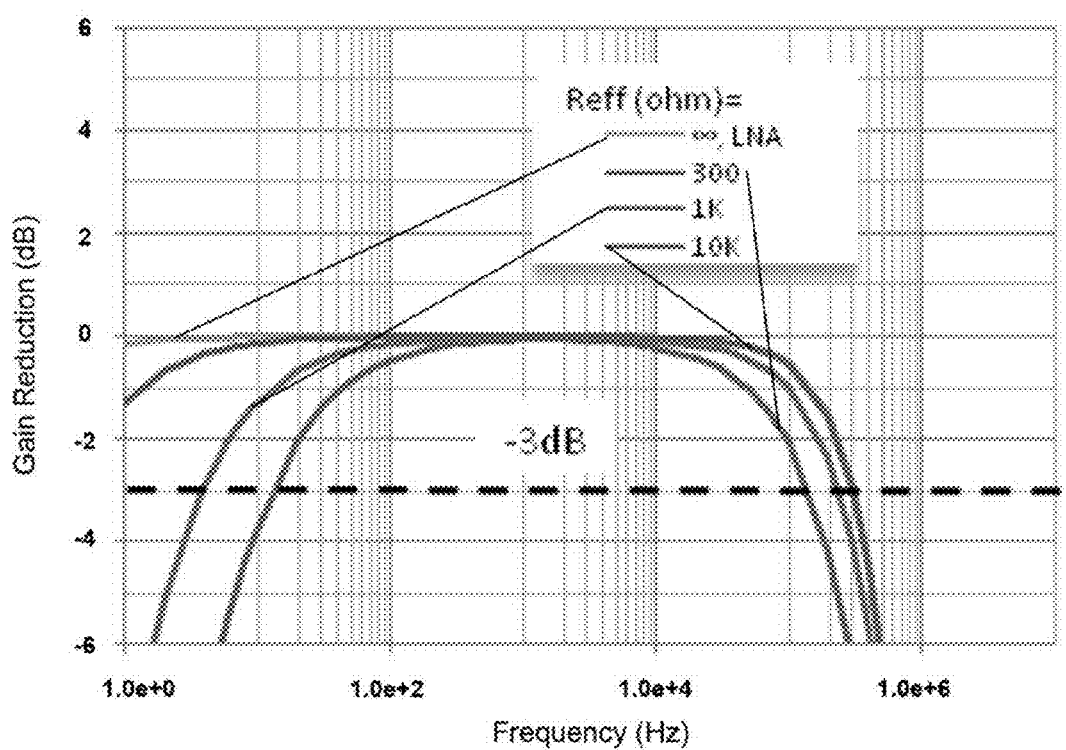
FIG. 15 illustrates impact of effective resistance to a noise measurement system using a current LNA according to aspects of the present disclosure.

Unlike the voltage amplifier, a current amplifier can be more immune to parasitic capacitance. As long as the DUT output impedance is sufficiently high, a measurement system with a current amplifier may yield better bandwidth than that of voltage amplifier system. FIG. 15 illustrates bandwidth reduction for a current amplifier system. In this example, where $C_T=80$ pF is used. The rolling off at the low frequency end may be caused by coupling capacitance $C_{in}$. When frequency gets lower, the effective input impedance may increase for a current LNA. This can reduce the gain of the current LNA. At the high frequency end, $f_T$ may primarily be limited by the native bandwidth of the LNA that can promote the impact of the parasitic tray inductance and lead to a reduction in $f_T$.

Selecting a loading resistor to match the DUT output impedance may be critical for system resolution. According to aspects of the present disclosure, $R_L$ is made larger than $R_{out}$ as long as the bandwidth requirement can be met.

As shown in FIG. 14, it shows impact of $R_L$ value to a noise measurement system with a voltage LNA. In this example, $R_{eff}=R_{out}//R_L R_{in}=100K$, and $R_L=R_{out}$. Two $C_T$ values are used to emulate the effects of a test fixture (solid lines, $C_T=10$ pF) and a prober (dash lines, $C_T=80$ pF). The Reff=0 curve represents the intrinsic LNA bandwidth data (The LNA input shorts to the ground). The cutoff frequency, $f_T$, is defined where the gain of the system rolls down by 3 dB.

FIG. 15 illustrates impact of effective resistance to a noise measurement system using a current LNA according to aspects of the present disclosure. In the example shown in FIG. 15, the impact of $R_{eff}$ to a noise measurement system with a current LNA, where $R_{eff}=R_{out}//R_L$ and $R_L=R_{out}$. The $C_T$ value of 80 pF is chosen. The Reff=∞ curve represents the LNA intrinsic bandwidth data, where the LNA input connects nothing.

Figure 16:
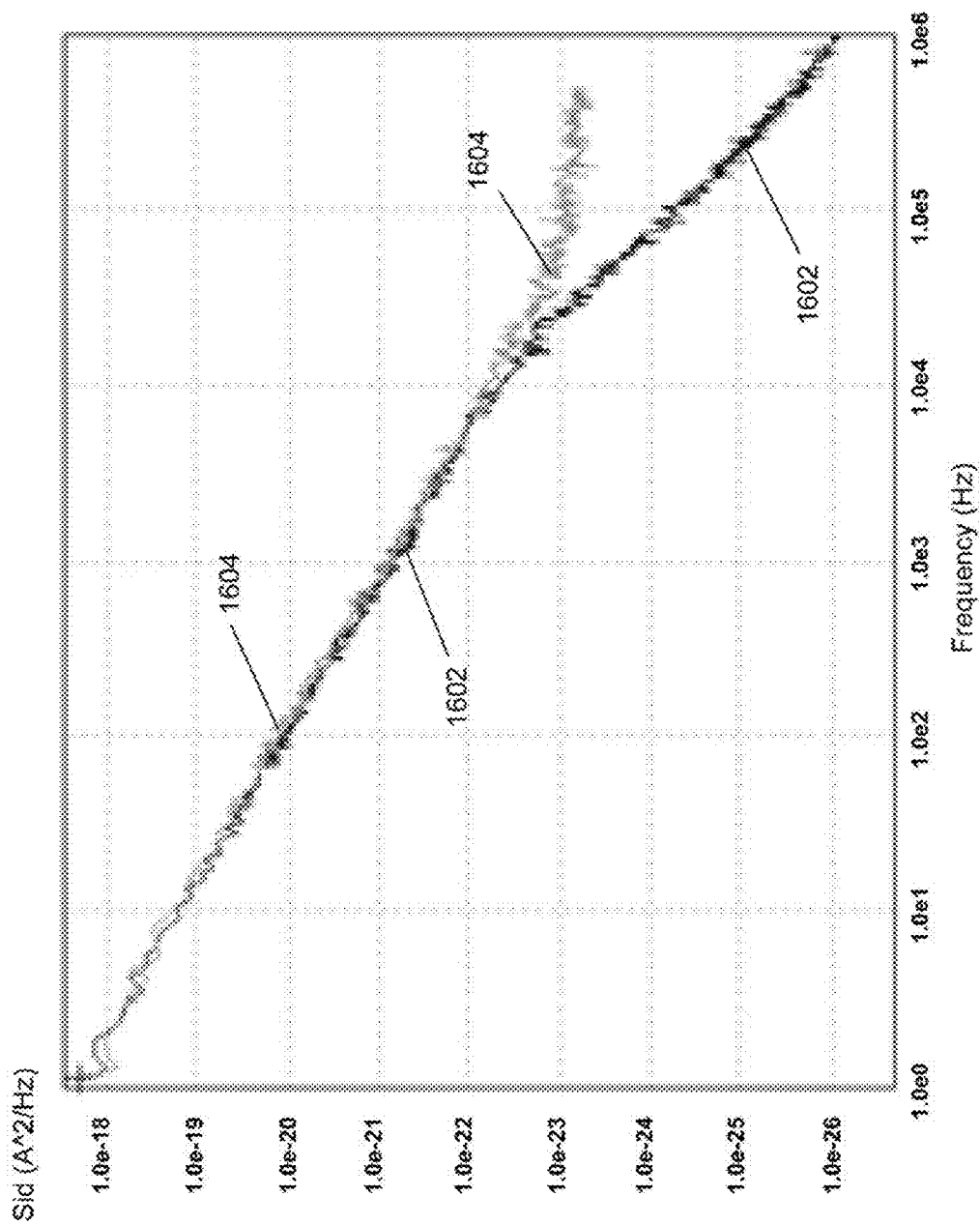
FIG. 16 illustrates a comparison of noise measurement systems with a current LNA and with a voltage LNA according to aspects of the present disclosure.

FIG. 16 illustrates a comparison of noise measurement systems with a current LNA and with a voltage LNA according to aspects of the present disclosure. As a direct comparison of the differences between current and voltage LNA systems in terms of their bandwidths when working with an on wafer prober, FIG. 16 illustrates two measurement results from the same MOSFET device. In this example, the output impedance of the DUT is high, $R_{out}$=500K and $R_L$=100K. Both curves agree well as the noise level is above the system resolution at below 10 KHz. When f>10 KHz, the voltage LNA system (shown by plot 1602) starts to roll off due to the parasitic $C_T$ while the current LNA system (shown by plot 1604) still works normally until it hits the LNA bandwidth.

FIG. 16 shows the comparison for noise measurement systems with a current LNA (shown by plot 1602) or with a voltage LNA (shown by plot 1604). Although the voltage LNA has better intrinsic bandwidth of 10 MHz than that of the current LNA (1 MHz), the current LNA system shows better system bandwidth of >500 KHz when DUT impedance is high.

Flicker noise measurement can be challenging, especially for >1M Hz bandwidth and <1×10$^{-25}$ A$^2$/Hz ultra-low noise signals. Due to wide impedance variation for difference DUTs and operational conditions with different biases, it can be difficult to use one type of system configuration to measure all of the DUTs, even with programmable load and input resistors, filter time constants, and system gains may help. According to aspects of the present disclosure, a multi-LNA configuration can be used to cover wider range of applications. Such a system has been proven to be efficient and versatile to measure various semiconductor devices. Along with the system resolution, such a system can also balance the efficiency of the measurement and throughput at wafer level, and ease of maintenance. If accuracy and resolution are the main targets, other type of measurement configurations such as correlated noise cancellation techniques may help to further reduce the impact of the LNA noise and enable ultra-low frequency (<0.1 Hz), ultra-low level (<1×10-26 A^2/Hz) flicker noise measurement.

Figure 17:
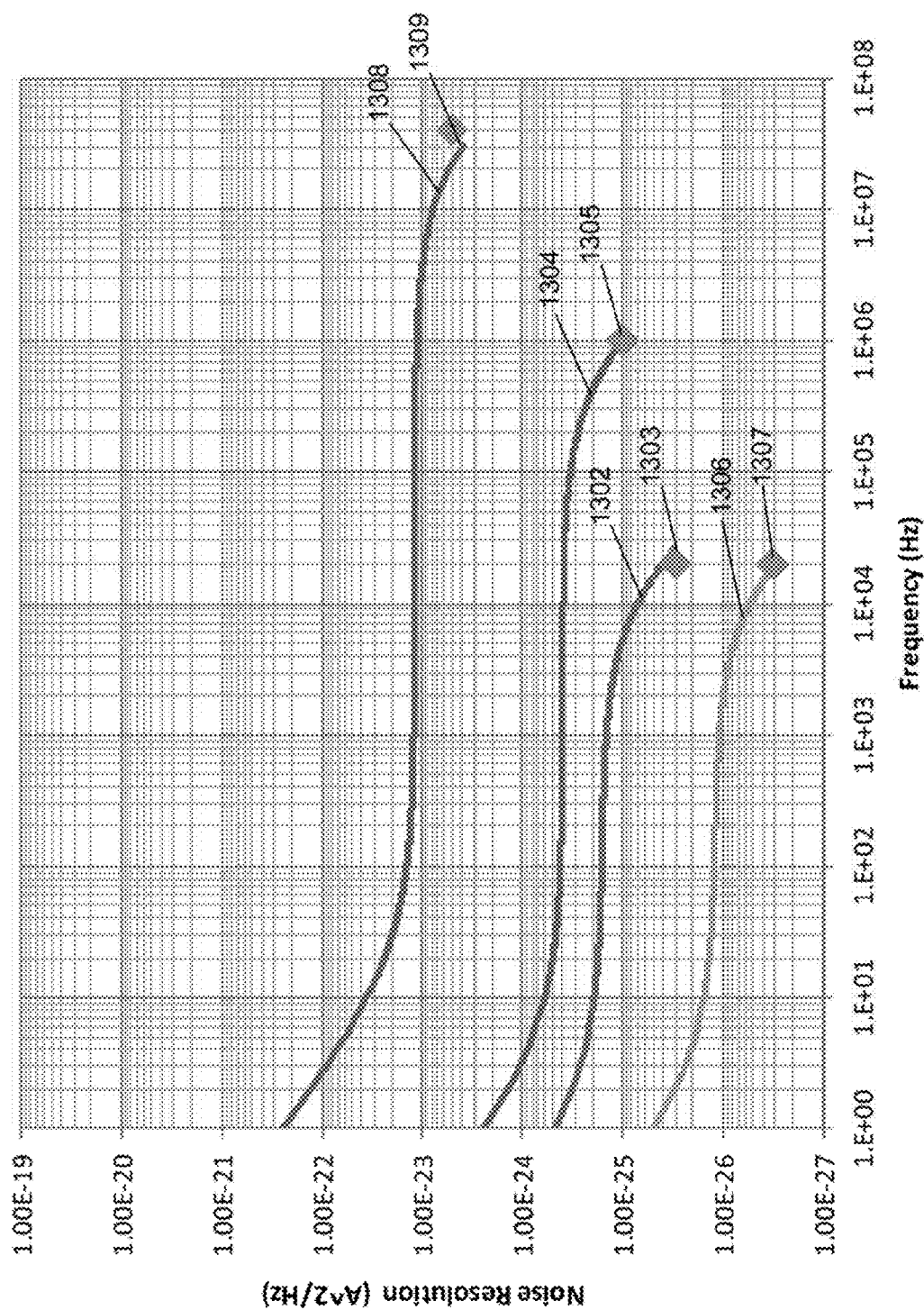
FIG. 17 illustrates a comparison of noise resolutions and bandwidths of different types of LNAs according to aspects of the present disclosure.

FIG. 17 illustrates a comparison of noise resolutions and bandwidths of different types of LNAs according to aspects of the present disclosure. In the example shown in FIG. 17, the horizontal axis represents bandwidth and the vertical axis represents noise resolution. In particular embodiments of the present disclosure, curve 1302 represents a voltage LNA and its corresponding 3 dB rolling off point 1303. Curve 1304 represents a current LNA and its corresponding 3 dB rolling off point 1305. Curve 1306 represents a high precision LNA and its corresponding 3 dB rolling off point 1307. Curve 1308 represents a wideband LNA and its corresponding 3 dB rolling off point 1309. According to aspects of the present disclosure, the different LNAs may be selected to measure flicker noise based on the signal output characteristics of a device under test according to methods described in association with FIG. 2 and FIG. 3 above, for example. Note that, for each LNA, flicker noise above the resolution line and between 1 (1.E+00) to the rolling off frequency can be measured accurately.

Figure 18:
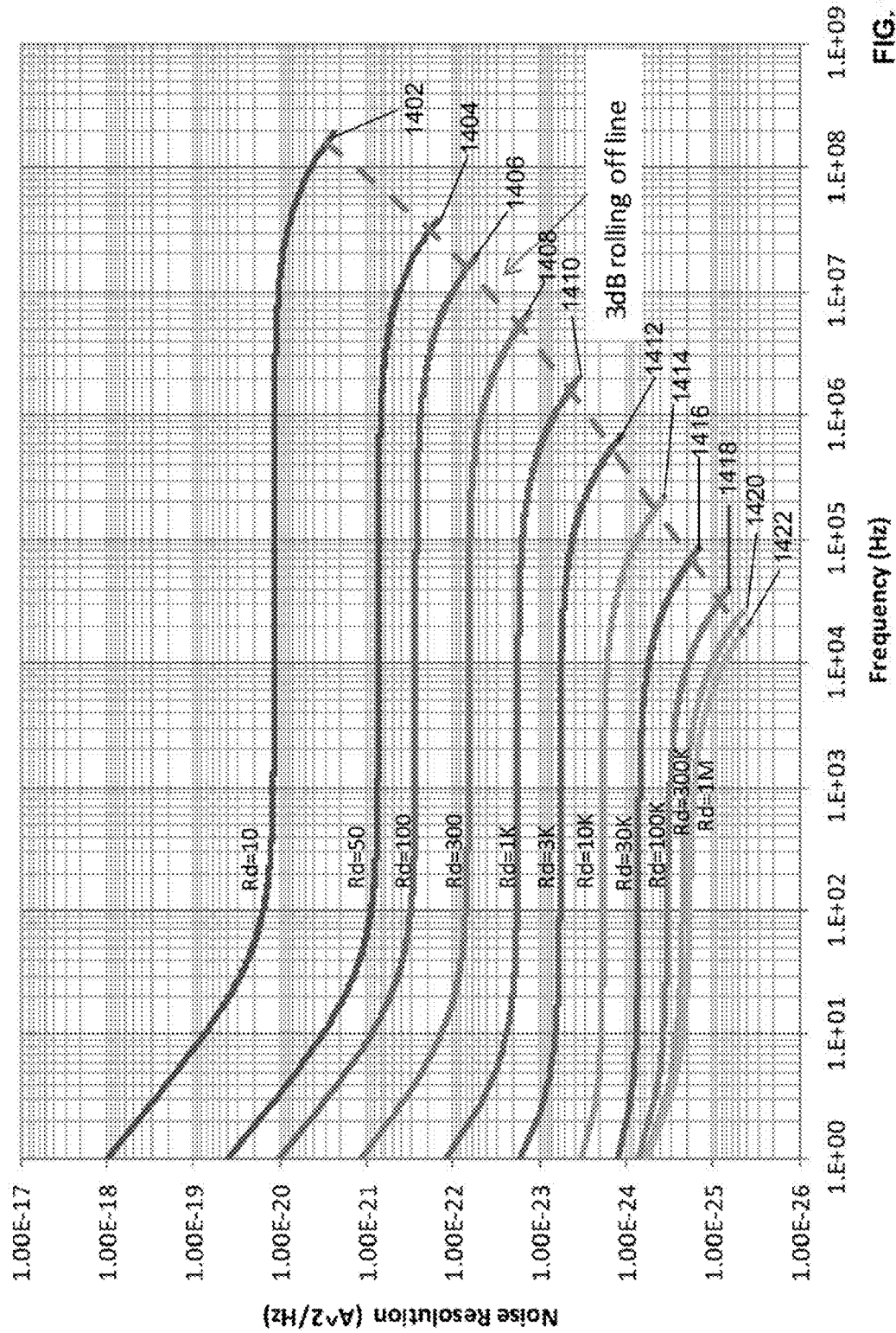
FIG. 18 illustrates a comparison of noise resolutions of a voltage LNA with different load resistor according to aspects of the present disclosure.

FIG. 18 illustrates a comparison of noise resolutions of a voltage LNA with different load resistor according to aspects of the present disclosure. As shown in FIG. 18, the horizontal axis represents bandwidth and the vertical axis represents noise resolution. In particular embodiments of the present disclosure, dotted line 1802 represents the 3 dB rolling off line of the exemplary voltage LNA with different Rd values. Curve 1402 represents noise resolution with respect to bandwidth at Rd being approximately 10 ohm. Curve 1404 represents noise resolution with respect to bandwidth at Rd being approximately 50 ohm. Curve 1406 represents noise resolution with respect to bandwidth at Rd being approximately 100 ohm. Curve 1408 represents noise resolution with respect to bandwidth at Rd being approximately 300 ohm. Curve 1410 represents noise resolution with respect to bandwidth at Rd being approximately 1K ohm. Curve 1412 represents noise resolution with respect to bandwidth at Rd being approximately 3 K ohm. Curve 1414 represents noise resolution with respect to bandwidth at Rd being approximately 10 K ohm. Curve 1416 represents noise resolution with respect to bandwidth at Rd being approximately 30 K ohm. Curve 1418 represents noise resolution with respect to bandwidth at Rd being approximately 100 K ohm. Curve 1420 represents noise resolution with respect to bandwidth at Rd being approximately 300 K ohm. Curve 1422 represents noise resolution with respect to bandwidth at Rd being approximately 1 M ohm.

According to aspects of the present disclosure, the different Rd values may be selected to measure flicker noise of a DUT, and different LNA may be selected based on the different output impedance of a device under test according to methods described in association with FIG. 2 and FIG. 3 above, for example. Note that, for each LNA, flicker noise above the resolution line and between 1 (1.E+00) to the rolling off frequency at a given Rd can be measured accurately. Note that when using voltage LNA, smaller value Rd can produce wider bandwidth but lower noise resolution for a flicker noise measurement apparatus. For current LNAs, the value of the Rd may not affect bandwidth, but may affect noise resolution of the flicker noise measurement apparatus. For most LNAs, in order to get a higher noise resolution, it may be desirable to have Rd be greater than Rout.

FIG. 19 illustrates an exemplary method for charging a noise measurement system according to aspects of the present disclosure. As shown in FIG. 19, in block 1902, the method provides a first circuit path configured to drive a first terminal of a device under test (DUT) in the noise measurement system. In block 1904, the method provides a charging circuit path configured to charge the first terminal of the DUT in a setup phase. In block 1906, the method charges the first terminal of the DUT to a predetermined voltage using the first circuit path and the charging circuit path in the setup phase.

According to aspects of the present disclosure, the method further provides a second circuit path configured to drive a second terminal of the DUT, provides a third circuit path configured to couple a third terminal of the DUT to a circuit ground, provides a fourth circuit path configured to couple a substrate of the DUT to the circuit ground, provides an amplification circuit configured to amplify an output signal of the DUT, and provides a decoupling circuit configured to decouple the DUT and the amplification circuit. In addition, the method monitors a first current in the first circuit path and monitoring a charging current in the charging path, determines whether the first terminal of the DUT has reached the predetermined voltage based on the first current and the charging current, and disconnects the charging circuit path in response to the first terminal of the DUT has reached the predetermined voltage. The method further performs noise measurements on the DUT using the first circuit path, the second circuit path, the third circuit path, the fourth circuit path, the amplification circuit, and the decoupling circuit in a measurement phase.

In a particular embodiment, the first circuit path includes a first source measurement unit (SMU), a first noise filter, and a variable load resistor. The charging circuit path includes a voltage source, and a programmable switch. The second circuit path includes a second source measurement unit (SMU), and a second noise filter. The first or second source measurement unit (SMU) comprises a biased power source, a volt meter and a current meter. The programmable switch is configured to connect the voltage source to the first terminal of the DUT during the setup phase and disconnect the voltage source to the first terminal of the DUT during a measurement phase; and wherein the charging circuit path has substantially zero impedance when the voltage source is connected to the first terminal of the DUT. The decoupling circuit is configured to decouple a direct current path between the DUT and the amplification circuit, and provide an alternating current path from the DUT to the amplification circuit. The decoupling circuit comprises a first discharging switch, wherein the first discharging switch is configured to discharge the first terminal of the DUT to a circuit ground after a measurement phase. The second circuit path comprises a second discharging switch, wherein the second discharging switch is configured to discharge the second terminal of the DUT to the circuit ground after the measurement phase.

FIG. 20 illustrates an exemplary method for measuring flicker noise of a device under test according to aspects of the present disclosure. As shown in FIG. 20, in block 2002, the method provides a device under test in a noise measurement system, where noise measurement system includes an amplification circuit configured to amplify an output signal of the DUT. In block 2004, the method detects output signal characteristics of the DUT. In block 2006, the method adjusts input impedance of the amplification circuit based on the output signal characteristics of the DUT. In block 2008, the method measures the flicker noise of the DUT using the amplification circuit with adjusted input impedance.

In a particular embodiment of the present disclosure, the noise measurement system further includes a first circuit path configured to drive a first terminal of the DUT, a second circuit path configured to drive a second terminal of the DUT, a third circuit path configured to couple a third terminal of the DUT to a circuit ground, and a decoupling circuit configured to decouple the DUT and the amplification circuit. The first circuit path includes a first source-measurement unit (SMU), a first noise filter, and a variable load resistor, and the second circuit path comprises a second source-measurement unit (SMU), a second noise filter. The first or second SMU includes a biased power source, a volt meter and a current meter. The amplification circuit may include at least one of a direct current coupling amplifier, or an alternate current coupling amplifier. The amplification circuit may also include at least one of a differential amplifier, or a single-ended differential amplifier. The amplification circuit may further include at least one of a voltage low noise amplifier, or a current low noise amplifier. The voltage low noise amplifier or the current low noise amplifier may be at least one of a high resolution amplifier, a low resolution amplifier, a high bandwidth amplifier, or a low bandwidth amplifier.

According to aspects of the present disclosure, the method of adjusting input impedance of the amplification circuit may include selecting a first amplifier in a plurality of amplifiers of the amplification circuit to be used to measure the flicker noise based on the output signal characteristics of the DUT. The method of adjusting input impedance of the amplification circuit may further include detecting changes in the output signal characteristics of the DUT, selecting a second amplifier in the plurality of amplifiers to measure the flicker noise based on the changes in the output signal characteristics of the DUT, and transitioning from the first amplifier to the second amplifier to measure the flicker noise. The method of transitioning from the first amplifier to the second amplifier may include transitioning from a high sensitivity low noise amplifier to a low sensitivity low noise amplifier to obtain bandwidth for measuring the flicker noise.

The methodologies described herein may be implemented by various means depending upon applications according to particular examples. For example, such methodologies may be implemented in hardware, firmware, software, or combinations thereof. In a hardware implementation, for example, a processing unit may be implemented within one or more application specific integrated circuits ("ASICs"), digital signal processors ("DSPs"), digital signal processing devices ("DSPDs"), programmable logic devices ("PLDs"), field programmable gate arrays ("FPGAs"), processors, controllers, micro-controllers, microprocessors, electronic devices, other devices units designed to perform the functions described herein, or combinations thereof.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Reference throughout this specification to "one example" or "an example" means that a particular feature, structure, or characteristic described in connection with the example is included in at least one example of claimed subject matter. Thus, the appearances of the phrase "in one example" or "an example" in various places throughout this specification are not necessarily all referring to the same example. Furthermore, the particular features, structures, or characteristics may be combined in one or more examples. Examples described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A noise measurement system, comprising:
   a first circuit path configured to drive a first terminal of a device under test (DUT) in the noise measurement system;
   an amplification circuit configured to amplify an output signal of the DUT;
   a second circuit path configured to drive a second terminal of the DUT, a third circuit path configured to couple a third terminal of the DUT to a circuit ground, and a decoupling circuit configured to decouple the DUT and the amplification circuit;
   logic configured to detect output signal characteristics of the DUT;
   logic configured to adjust input impedance of the amplification circuit based on the output signal characteristics of the DUT, comprising logic configured to select a first amplifier in a plurality of amplifiers of the amplification circuit to be used to measure the flicker noise based on the output signal characteristics of the DUT; and
   logic configured to measure a flicker noise of the DUT using the amplification circuit with adjusted input impedance.

2. The noise measurement system of claim 1, wherein the noise measurement system further comprises:
   a fourth circuit path configured to couple a substrate of the DUT to the circuit ground.

3. The noise measurement system of claim 2, wherein the first circuit path comprises a first source-measurement unit (SMU), a first noise filter, and a variable load resistor, wherein the first SMU comprises a biased power source, a volt meter and a current meter; and the second circuit path comprises a second source-measurement unit (SMU), a second noise filter, wherein the first SMU comprises a biased power source, a volt meter and a current meter.

4. The noise measurement system of claim 1, wherein the logic configured to adjust input impedance of the amplification circuit further comprises:
   logic configured to detect changes in the output signal characteristics of the DUT;
   logic configured to select a second amplifier in the plurality of amplifiers to measure the flicker noise based on the changes in the output signal characteristics of the DUT; and
   logic configured to transition from the first amplifier to the second amplifier to measure the flicker noise.

5. The noise measurement system of claim 4, wherein logic configured to transition from the first amplifier to the second amplifier comprises:
   logic configured to transition from a high sensitivity low noise amplifier to a low sensitivity low noise amplifier to obtain bandwidth for measuring the flicker noise.

6. The noise measurement system of claim 1, wherein the amplification circuit comprises at least one of:
   a direct current coupling amplifier; or
   an alternate current coupling amplifier.

7. The noise measurement system of claim 1, wherein the amplification circuit comprises at least one of:
   a differential amplifier; or
   a single-ended differential amplifier.

8. The noise measurement system of claim 1, wherein the amplification circuit comprises at least one of:
   a voltage low noise amplifier; or
   a current low noise amplifier.

9. The noise measurement system of claim 8, wherein the amplification circuit comprises at least one of:
   a high resolution amplifier;
   a low resolution amplifier;
   a high bandwidth amplifier; or
   a low bandwidth amplifier.

10. A method of measuring flicker noise, comprising:
    providing a device under test (DUT) in a noise measurement system; wherein the noise measurement system comprises an amplification circuit configured to amplify an output signal of the DUT;
    detecting output signal characteristics of the DUT;
    adjusting input impedance of the amplification circuit based on the output signal characteristics of the DUT, comprising selecting a first amplifier in a plurality of amplifiers of the amplification circuit to be used to measure the flicker noise based on the output signal characteristics of the DUT; and
    measuring the flicker noise of the DUT using the amplification circuit with adjusted input impedance.

11. The method of claim 10, wherein the noise measurement system further comprises:
    a first circuit path configured to drive a first terminal of the DUT, a second circuit path configured to drive a second terminal of the DUT, a third circuit path configured to couple a third terminal of the DUT to a circuit ground, and a decoupling circuit configured to decouple the DUT and the amplification circuit.

12. The method of claim 11, wherein
    the first circuit path comprises a first source-measurement unit (SMU), a first noise filter, and a variable load resistor, wherein the first SMU comprises a biased power source, a volt meter and a current meter; and the second circuit path comprises a second source-measurement unit (SMU), a second noise filter, wherein the first SMU comprises a biased power source, a volt meter and a current meter.

13. The method of claim 10, wherein the adjusting input impedance of the amplification circuit further comprises:
    detecting changes in the output signal characteristics of the DUT;
    selecting a second amplifier in the plurality of amplifiers to measure the flicker noise based on the changes in the output signal characteristics of the DUT; and
    transitioning from the first amplifier to the second amplifier to measure the flicker noise.

14. The method of claim 13, wherein the transitioning from the first amplifier to the second amplifier comprises:
    transitioning from a high sensitivity low noise amplifier to a low sensitivity low noise amplifier to obtain bandwidth for measuring the flicker noise.

15. The method of claim 10, wherein the amplification circuit comprises at least one of:
    a direct current coupling amplifier; or
    an alternate current coupling amplifier.

16. The method of claim 10, wherein the amplification circuit comprises at least one of:
    a differential amplifier; or
    a single-ended differential amplifier.

17. The method of claim 10, wherein the amplification circuit comprises at least one of:
    a voltage low noise amplifier; or
    a current low noise amplifier.

18. The method of claim 17, wherein the amplification circuit comprises at least one of:
    a high resolution amplifier;
    a low resolution amplifier;
    a high bandwidth amplifier; or
    a low bandwidth amplifier.

* * * * *